(12) United States Patent
Tanaka

(10) Patent No.: US 7,126,836 B2
(45) Date of Patent: Oct. 24, 2006

(54) SEMICONDUCTOR DEVICE, SYSTEM DEVICE USING IT, AND MANUFACTURING METHOD OF A SEMICONDUCTOR DEVICE

(75) Inventor: Yoshiyuki Tanaka, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/809,459

(22) Filed: Mar. 26, 2004

(65) Prior Publication Data

US 2004/0245626 A1    Dec. 9, 2004

(30) Foreign Application Priority Data

Mar. 27, 2003    (JP)    ............ P. 2003-089279

(51) Int. Cl.
*G11C 5/06*    (2006.01)
(52) U.S. Cl. ............ 365/63; 365/185.09; 365/201; 365/195
(58) Field of Classification Search ............ 365/63, 365/185.09, 201, 195
See application file for complete search history.

(56) References Cited

U.S. PATENT DOCUMENTS

| | | | |
|---|---|---|---|
| 5,295,101 A | 3/1994 | Stephens, Jr. et al. | |
| 6,310,806 B1* | 10/2001 | Higashi et al. | 365/200 |
| 6,600,683 B1* | 7/2003 | Yamane | 365/195 |
| 6,784,797 B1* | 8/2004 | Smith et al. | 340/573.4 |
| 2003/0198083 A1 | 10/2003 | Akaogi et al. | |
| 2004/0022089 A1* | 2/2004 | Yamane | 365/195 |
| 2004/0061518 A1* | 4/2004 | Watanabe et al. | 324/765 |

FOREIGN PATENT DOCUMENTS

| | | |
|---|---|---|
| CN | 1163483 A | 10/1997 |
| JP | 8-167703 | 6/1996 |

* cited by examiner

*Primary Examiner*—Van Thu Nguyen
*Assistant Examiner*—N Nguyen
(74) *Attorney, Agent, or Firm*—McDermott Will & Emery LLP

(57) ABSTRACT

To reduce the size and the power consumption of a semiconductor device. A first circuit having a prescribed circuit function is provided. A second circuit which can be connected to the first circuit externally gives the first circuit a non-always-used particular function so that the first circuit can perform the particular function.

3 Claims, 25 Drawing Sheets

FIG. 8 (a)
FIG. 8 (b)
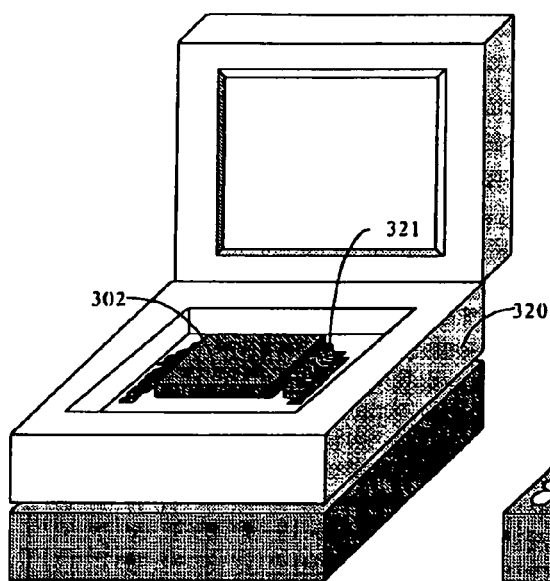
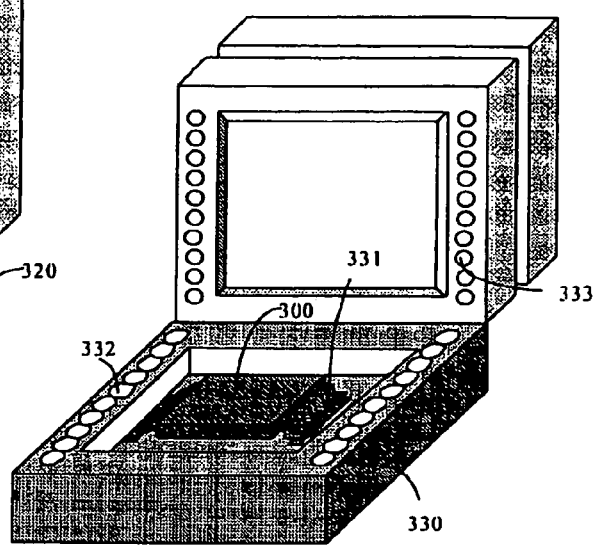

SEMICONDUCTOR DEVICE, SYSTEM DEVICE USING IT, AND MANUFACTURING METHOD OF A SEMICONDUCTOR DEVICE

BACKGROUND OF THE INVENTION

1. Filed of the Invention

The present invention relates to a semiconductor device, a system device using it, and a manufacturing method of a semiconductor device.

2. Description of the Related Art

With marked increase in the functionality of electronic equipment, semiconductor devices are increasingly required to be increased in operation speed and reduced in size and weight through miniaturization. In recent years, to satisfy these requirements, ULSIs (ultra large scale integrated circuits) have been miniaturized and increased in integration density.

In the above circumstances, the technique called "system in package (SIP)" was proposed. For example, memory rewriting is possible in microcomputers etc. that are equipped with a flash memory. Such a rewriting function itself is not always used and is necessary only when rewriting needs to be performed. However, usually, such a rewriting function is also implemented (integrated) on the same substrate (Japanese Patent No. 2,790,461 and Japanese Patent No. 2,977,576 and Japanese Patent No. 2,954,278 and Japanese Patent No. 3,358,710)

However, as the functionality and the integration density are increased, there arises a problem that it is difficult to further miniaturize semiconductor chips (microcomputer chips) of microcomputers.

Another problem is that the inclusion of particular functions that are not always used increases the power consumed.

SUMMARY OF THE INVENTION

The present invention has been made in view of the above circumstances, and an object of the invention is therefore to reduce the size and the power consumption of a semiconductor device.

To attain the above object, the invention provides a semiconductor device characterized in that it comprises a first circuit having a prescribed circuit function, and that a second circuit is formed so as to be able to be connected externally to the first circuit so as to give the first circuit a non-always-used particular function and to thereby allow the first circuit to perform the particular function.

With this configuration, the second circuit having the non-always-used particular function is formed so as to be able to be connected externally to the first circuit. Therefore, the size and the power consumption of a semiconductor chip of the semiconductor device can be reduced.

It is desirable that the second circuit comprise an auxiliary function for realizing the particular function that has been given to the first circuit, and that the auxiliary function operate only in response to an instruction from the first circuit.

With this configuration, since the particular function operates only in response to an instruction from the first circuit, the second circuit does not operate solely and hence the security effect is enhanced.

It is desirable that the first circuit be used solely except during operation of the particular function.

With this configuration, the size, weight, and power consumption of the first circuit can be reduced.

It is desirable that the second circuit be configured so as to be able to operate solely.

It is desirable that the second circuit cannot be used except during operation of the particular function.

This configuration makes it possible to enhance the protection effect.

It is desirable that the first circuit have a function of outputting a control start signal for activating the second circuit and a function of receiving a signal for giving the particular function that is generated by the second circuit.

With this configuration, since the first circuit can control the start of the particular function, a user can make manipulations without being aware of the presence of the second circuit and hence can make manipulations very easily.

Further, it is desirable that the first circuit have a function of permitting operation of the particular function only when detecting electrical connection of the second circuit, and not permitting operation of the particular function and permitting operation of only the prescribed circuit function when not detecting electrical connection of the second circuit.

In this configuration, the first circuit permits operation of the particular function only when detecting electrical connection of the second circuit. Therefore, manipulations can be made easily and a security function can be obtained.

It is desirable that the first circuit be a memory circuit and the particular function of the second circuit be a function of writing data to the memory circuit.

With this configuration, the first circuit is required to be connected to the second circuit only in writing data to the memory. Therefore, the size and the power consumption of the device can be reduced.

It is desirable that the first circuit comprise a reading circuit for a memory and the particular function include a circuit for rewriting of the memory.

With this configuration, the rewriting circuit is not necessary during ordinary use and the first circuit is required to be connected to the second circuit only in rewriting of the memory. Therefore, the size and the power consumption of the device can be reduced.

It is desirable that the first circuit comprise a redundant circuit that is provided with wiring for forming prescribed logic blocks in the first circuit, and be configured in such a manner that its circuit function is determined by external redundancy setting, and that the particular function include a circuit for setting the redundant circuit.

With this configuration, the redundant circuit setting function that is not necessary during ordinary use can be used when it needs to be used by connecting the second circuit to the first circuit. Therefore, the size and the power consumption of the device can be reduced.

It is desirable that the first circuit comprise a programmable gate array FPGA (field programmable gate array).

It is desirable that a circuit function of the first circuit be determined by connections and disconnections of electric fuses, and that the particular function include a circuit for connecting and disconnecting the electric fuses.

With this configuration, the for connecting and disconnecting the electric fuse that is not necessary during ordinary use can be used when it needs to be used by connecting it to the first circuit. Therefore, Therefore, the device can be miniaturized and write protection can be attained.

still further, it is desirable that the prescribed function include a circuit for performing reading on a memory in the first circuit, and the particular function be a function of controlling output of information of the memory to an external apparatus.

With this configuration, the particular function is not used during ordinary use and is caused to operate only when a protection function is necessary. Therefore, the device can be miniaturized whereas a control function is attained.

It is desirable that the particular function include a testing circuit for the first circuit.

It is difficult to miniaturize devices that are required to incorporate a testing function. The invention can solve this problem, that is, makes it possible to incorporate a testing function without causing size increase.

A system device according to the invention is characterized by comprising a first device having a first circuit that provides a prescribed circuit function, and a second circuit electrically connected to the first circuit of the first device, the system device further characterized in that the second circuit gives the first circuit a non-always-used particular function and to thereby allow the first circuit to perform the particular function.

With this configuration, the functionality can be enhanced without increasing the size of the device.

It is desirable that the first circuit have a function of outputting a control start signal for activating the second circuit and a function of receiving a signal for giving the particular function that is generated by the second circuit.

With this configuration, the second circuit that has been activated by a signal supplied from the first circuit allows the first circuit performs the particular function. Therefore, the particular function can be realized in such a manner that a user can make manipulations with high controllability without being aware of the presence of the second circuit.

It is desirable that the second circuit have a function of receiving the control start signal generated by the first circuit and a function of outputting the signal for giving the particular function to the first circuit, and that the particular function of the second device be activated by the control start signal of the first device, whereby the particular function is given to the first device.

This configuration makes it possible to perform the particular function with high controllability.

It is desirable that each of the first device and the second device comprise an exchange circuit for serially supplying or receiving control signals for giving the particular function and a register for storing control signals for giving the particular function, and that signals be serially exchanged between the first device and the second device, whereby the particular function is given to the first device.

With this configuration, control signals are arranged in reading order and writing order in one-to-one correspondence and hence can be sent and received serially. The very simple configuration allows information to be exchanged as it is and hence enhanced ease of operation is attained.

It is preferable that the first device have a function of permitting operation of the particular function only when detecting electrical connection of the second device, and not permitting operation of the particular function and permitting operation of only the prescribed circuit function when not detecting electrical connection of the second device.

This configuration makes it possible to obtain a system device having high controllability.

A manufacturing method of a semiconductor device according to the invention is characterized by comprising a designing step of redesigning a circuit integrated on a semiconductor substrate so that it is function-separated into a first circuit and a second circuit that is configured so as to be able to be externally connected to the first circuit and to give the first circuit a non-always-used particular function to thereby allow the first circuit to perform the particular function, and so that the first circuit and the second circuit can be connected to each other electrically; a step of forming the first circuit in a first device; and a step of forming the second circuit in a second device.

This method makes it possible to miniaturize the first circuit without lowering the functionality.

It is desirable that the first device be implemented on a single semiconductor substrate and the second device be a system device comprising a plurality of semiconductor substrates.

This configuration makes it possible to further miniaturize the first device.

It is desirable that the first device comprise, on one major surface of a package, first connection terminals for connection to an external circuit, and the second device be formed so as to be able to be connected to the first device via second connection terminals that are formed on the other major surface of the package that is opposed to the first major surface.

This configuration makes the mounting and the detachment very easy.

It is desirable that the first device comprise first connection terminals for connection to an external circuit that extend from side surfaces of a package, and the second device be formed so as to be able to be connected to the first device via second connection terminals that are formed on a major surface of the package.

BRIEF DESXRIPTION OF THE DRAWINGS

FIG. 8 is a perspective view of a system device according to an eighth embodiment of the invention; FIG. 8 (*a*) shows a state that first and second devices are connected to each other and a particular function is made operational, and FIG. 8 (*b*) shows a state that the first device is used solely.

DESCRIPTION OF THE PREFERRED EMBODIMENTS

Next, embodiments of the present invention will be described in detail with reference to the drawings.

Embodiment 1

Figure 1:
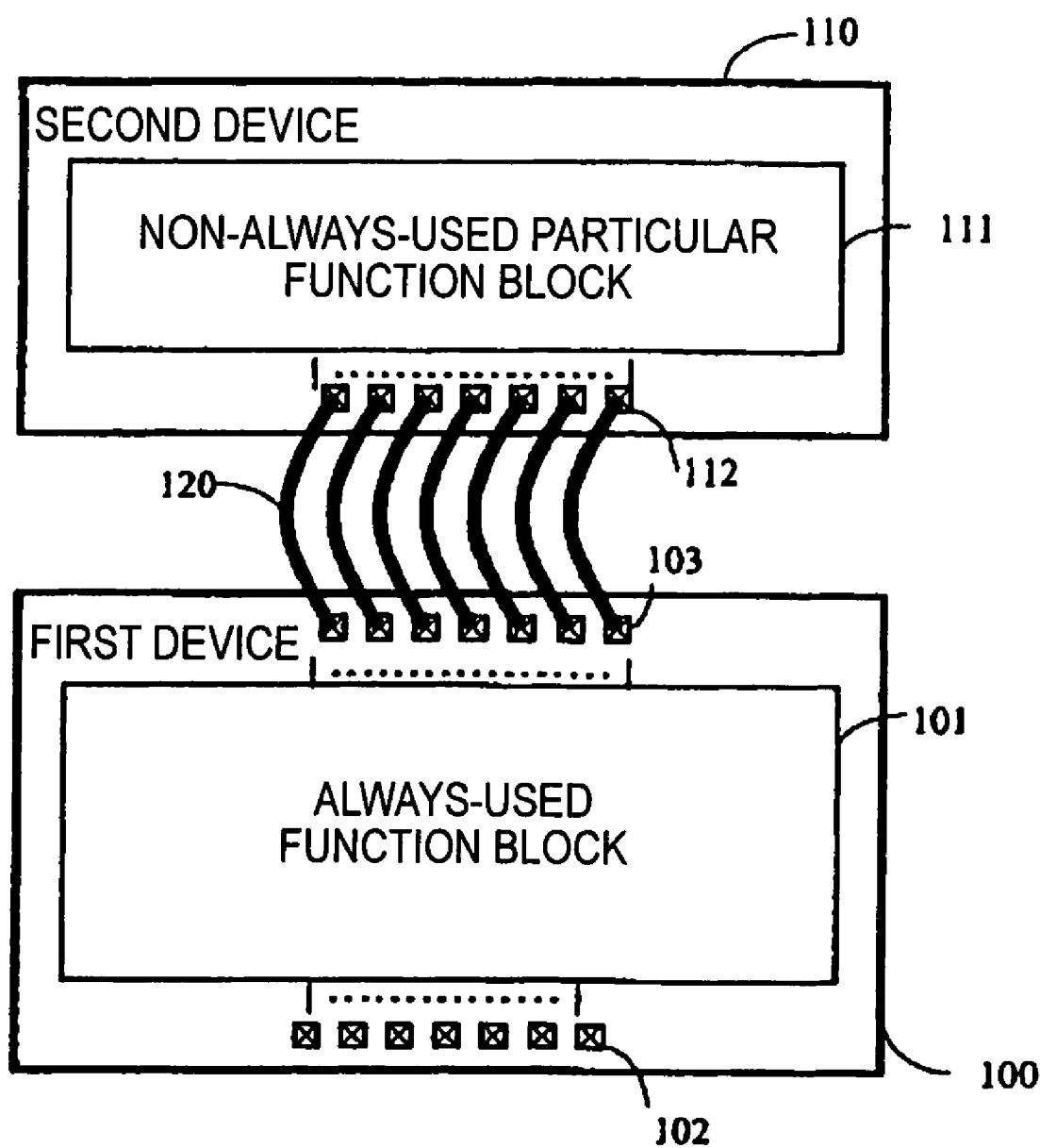
FIG. 1 is a conceptual diagram of a system device according to a first embodiment of the present invention.

As shown in FIG. 1, this system device is configured in such a manner that circuit functions are divided into two parts, that is, a first semiconductor device 100 having a function block 101 that is always used and a second device 110 having a particular function block 111 that is not always used and is connected to a first circuit of the first semiconductor device 100.

Connection lines 120 connect control bus terminals 103 of the first semiconductor device 100 and control bus terminals 112 of the second semiconductor device 110. The two devices 100 and 110 are connected to each other only when the particular function of the second device 110 is needed.

Signal input and output to and from the always-used function block 101 of the first semiconductor device 100 are performed via control terminals 102.

In this system device, the first device 100 has only the functions that are necessary during ordinary use and does not have the particular function. Therefore, the size of the first device 100 can be reduced to a large extent. The particular function that is not always used can be connected externally, which makes it possible to miniaturize and reduce the power consumption of the semiconductor device 100 without lowering the functionality of its semiconductor chip.

Embodiment 2

Figure 2:
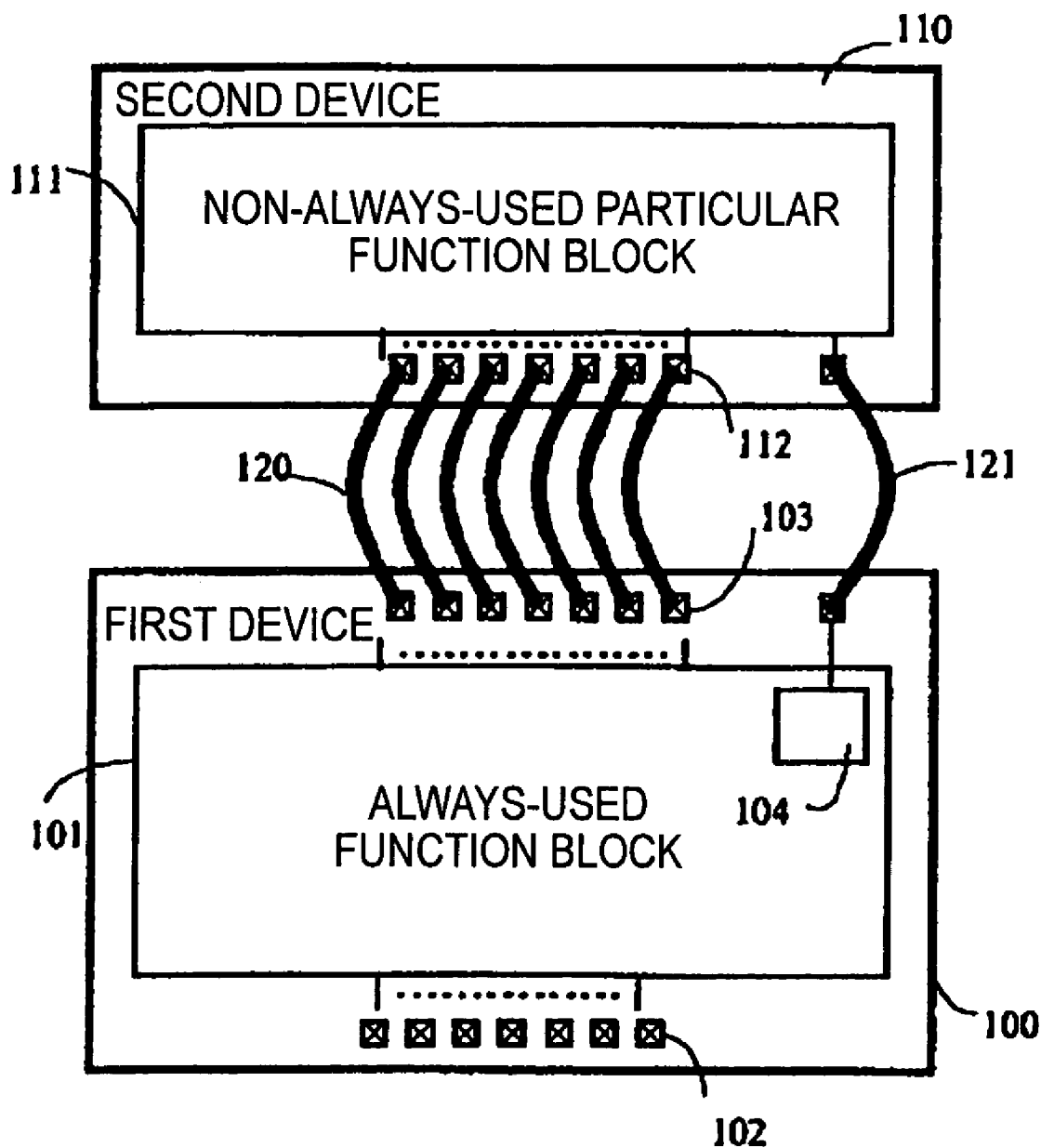
FIG. 2 is a conceptual diagram of a system device according to a second embodiment of the invention.

As shown in FIG. 2, this system device has the configuration of the first embodiment and, in addition, the second device 110 has an auxiliary function for realizing the particular function that has been given to the first circuit. The auxiliary function operates only in response to an instruction from the first circuit.

More specifically, the first device 100 has a control start signal generation circuit 104 for outputting a control start signal for activating the non-always-used particular function block 111. A control start signal generated by the circuit 104 is supplied to the second device 110 via a control start signal line 121. Signals generated by the particular function block 111 of the second device 110 are supplied to the first device 100 in the same manner as in the first embodiment.

With the above configuration, the first device 100 performs control as to whether to start the particular function. Therefore, a user can perform manipulations without being aware of the presence of the second device 110; he or she can perform manipulations very easily.

Embodiment 3

Figure 3:
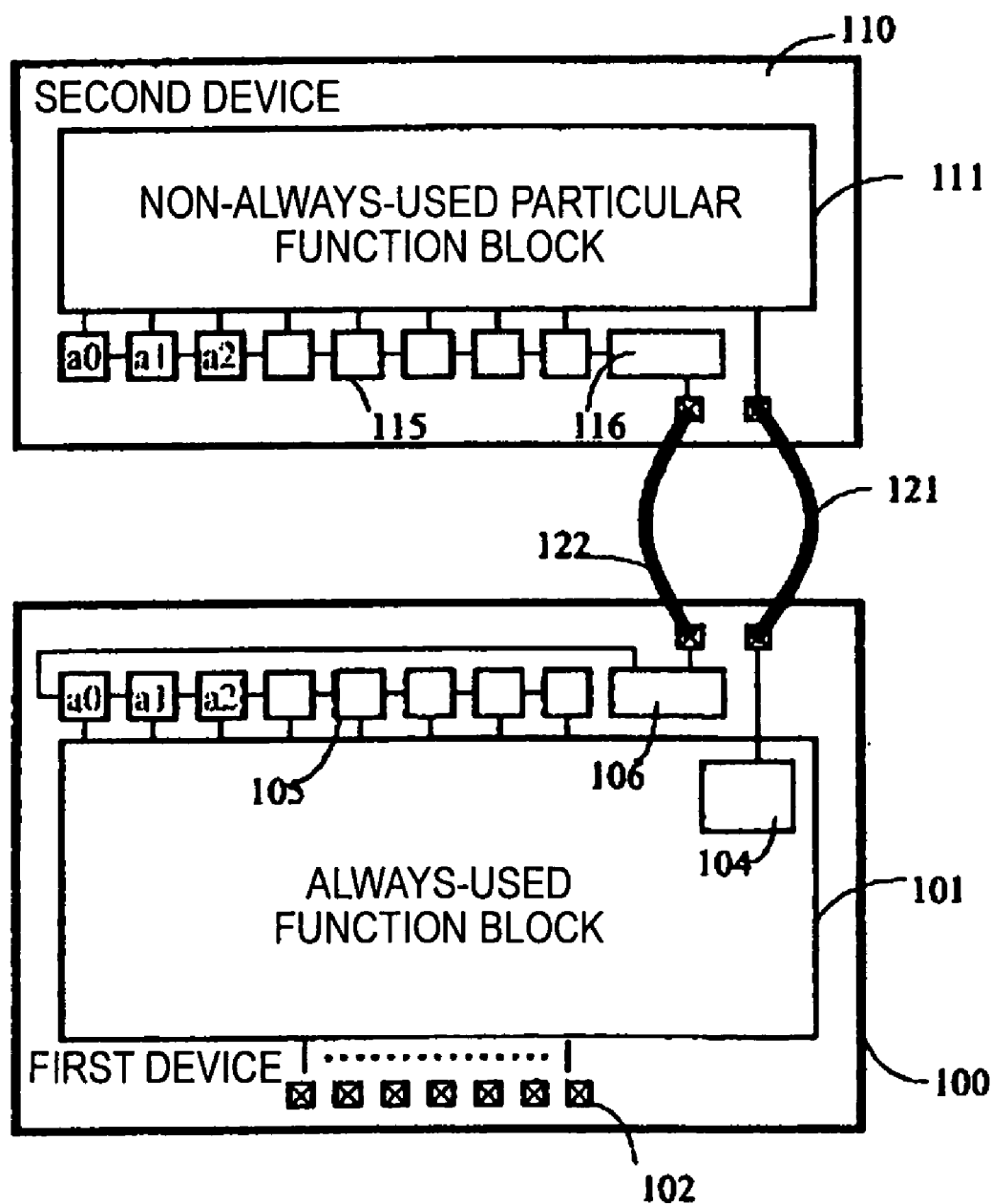
FIG. 3 is a conceptual diagram of a system device according to a third embodiment of the invention.

Whereas in the second embodiment signal exchange between the first device 100 and the second device 110 is performed via the ordinary connection lines, in this embodiment signal exchange is performed via serial interfaces 106 and 116 and serial control signal lines 122, as shown in FIG. 3.

The serial interfaces 106 and 116 are equipped with respective control signal register groups 105 and 106 (one-to-one correspondence). Signals are supplied to and stored in the register groups 105 and 106 serially.

With the above configuration, signal exchange can be performed with very high controllability. Miniaturization and power saving can be attained while functions can be effected in the same manner as if they were provided in the same device.

Embodiment 4

Figure 4:
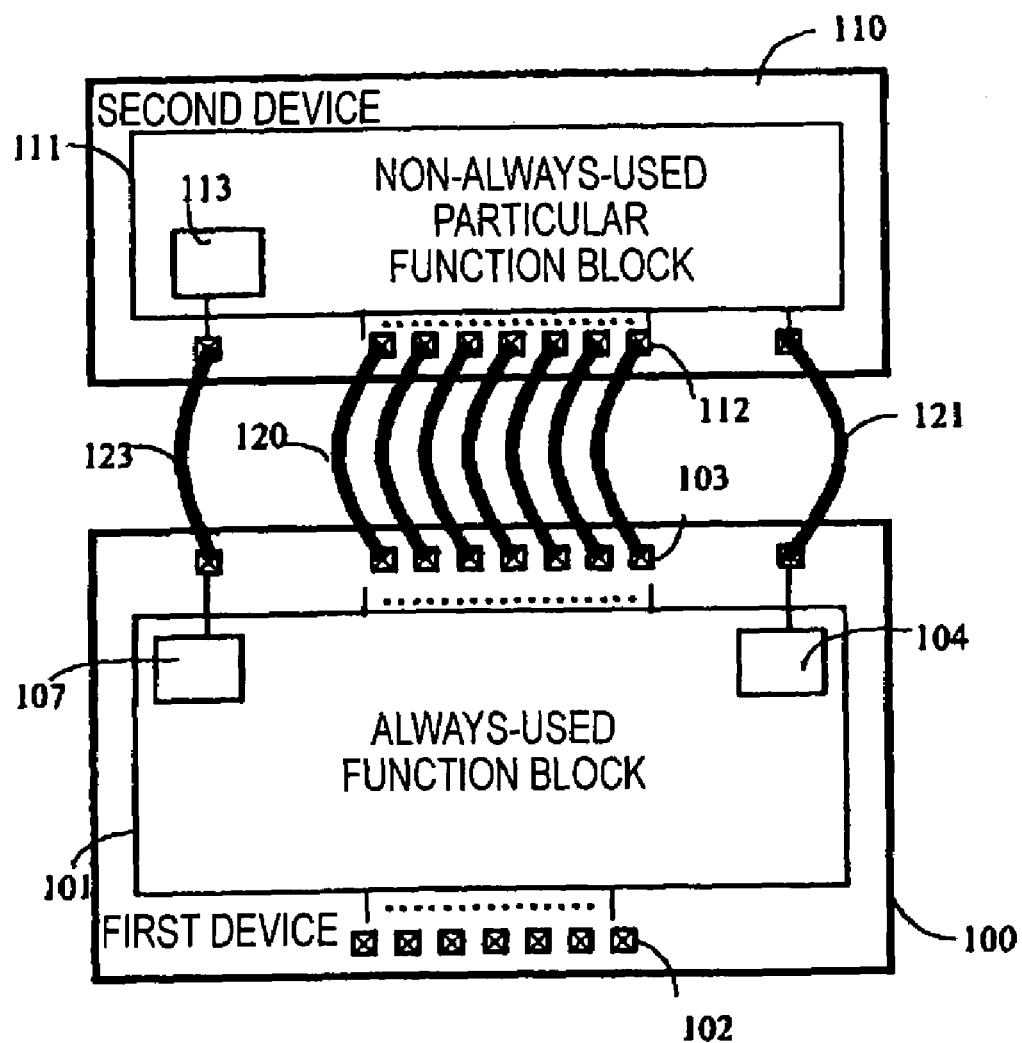
FIG. 4 is a conceptual diagram of a system device according to a fourth embodiment of the invention.

In the second embodiment signal exchange between the first device 100 and the second device 110 is performed via the ordinary connection lines. In contrast, as shown in FIG. 4, this embodiment is characterized as follows. The first device 100 detects whether or not the second device 110 is connected to it by means of a second device detection circuit 107 for detecting whether or not the second device 110 is electrically connected to the first device 100. The particular function is allowed to be performed only if it is judged that electrical connection is made. If electrical connection of the second device 110 is not detected, the particular function is not allowed to be performed and only a particular circuit function of the first device 100 is allowed to be performed. The other part of the configuration is the same as in the second embodiment.

In this embodiment, the second device 110 is equipped with an identification signal generation circuit 113 retaining identification information of the second device 110. And the second device detection circuit 107 of the first device 100 can check, via a second device identification signal line 123, whether the second device 110 is electrically connected to the first device 100.

With the above configuration, the first device 100 is allowed to perform the particular function only when the second device 110 is electrically connected to the first device 100. Manipulations are simple and a security function is obtained.

Embodiment 5

Whereas the first to fourth embodiments are directed to the functions of the first device 100 and the second device 110, this embodiment is directed to mounting structures.

Figure 5:
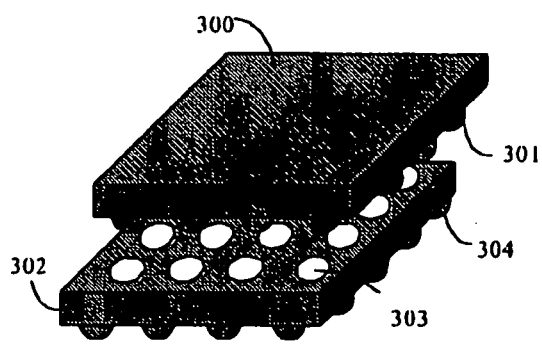
FIG. 5 is a perspective view of a system device according to a fifth embodiment of the invention.

As shown in FIG. 5, this embodiment is characterized in that a system device is configured in such a manner that a first package 302 mounted with a first semiconductor chip as a first device and a second package 300 mounted with a second semiconductor chip as a second device are laid on each other and are connected to each other by ball grid array (BGA) terminals 301.

More specifically, BGA terminals 304 as first connection terminals for connection to an external circuit are formed on a first major surface of the first package 302 and control bus terminals 303 are formed on its second major surface that is opposed to the first major surface. The BGA terminals as control bus terminal 301 are formed on the second package 300 so as to correspond to the respective control bus terminals 303 of the first package 302.

With the above configuration, connections can be made merely by laying the packages 300 and 302 on each other; mounting is facilitated and highly reliable connections can be obtained.

Where the first package 302 is used solely, it is appropriate to form an insulating cover to cover the control bus terminals 303 on the second major surface. On the other hand, where the first package 302 is used being connected to the second package 300, the first package 302 can easily be connected to the second package 300 electrically via the BGA terminals 304 by placing the second package 300 on the first package 302 and doing contact bonding or solder bonding.

Embodiment 6

Figure 6:
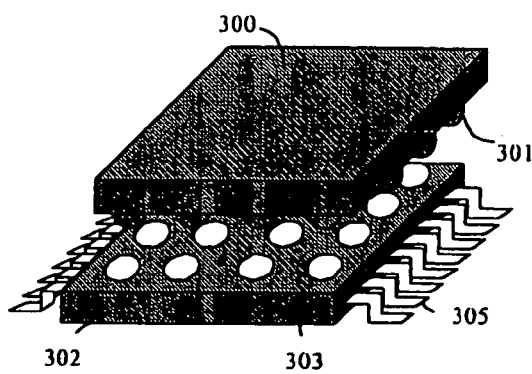
FIG. 6 is a perspective view of a system device according to a sixth embodiment of the invention.

In the fifth embodiment, the BGA terminals 304 are formed on the first major surface of the first semiconductor package 302 to serve as the first connection terminals. As shown in FIG. 6, this embodiment is different from the fifth embodiment in that lead terminals 305 extend from side surfaces of the first package 302. The other part of the configuration is the same as in the fifth embodiment.

With this configuration, the second device can easily be connected to the first device as in the case of the fifth embodiment and a semiconductor device can be formed in which connections can be made easily and reliably.

Each embodiment 5, 6 is one example of this invention, thus realizing one function by combining two packages is not limited by the embodiment 5 and the embodiment 6.

Embodiment 7

This embodiment provides a socket that enables detachable mounting in the system device of the sixth embodiment instead of fixed bonding such as solder bonding.

Figure 7:
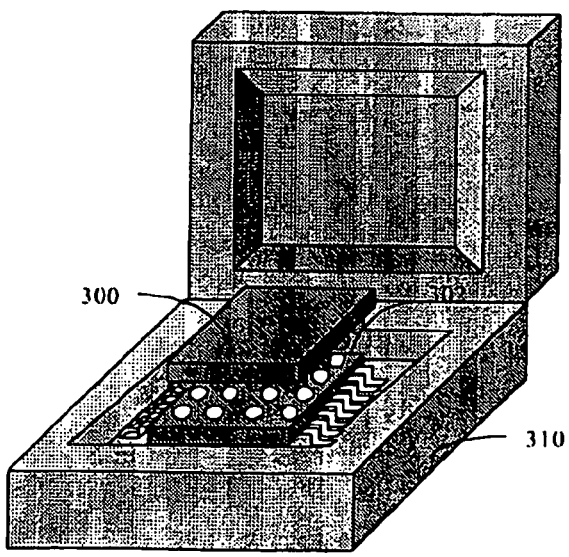
FIG. 7 is a perspective view of a system device according to a seventh embodiment of the invention.

More specifically, as shown in FIG. 7, this embodiment is characterized in that a connection socket 310 hating a detachable lid is provided. The first package 302 is placed in a recess of a first major surface of the main body of the connection socket 310 and connections are made to the lead terminals 305. The second package 300 is laid on the top surface of the first package 302 and the lid of the socket 310 turned down. The pressure from the lid ensures electrical connections between the first and second semiconductor chips.

With this configuration, connections can be made easily and detachable mounting is attained. This makes it possible to provide a highly reliably semiconductor device.

To make the contact between the first package 302 and the second package 300 more reliable, a locking jig may be used when necessary.

Embodiment 8

This embodiment is directed to a modified version of the socket 310 of the seventh embodiment. In this embodiment, as shown in FIG. 8, a socket has a 3-stage structure consisting of a first substrate 330, a second substrate 320, and a lid. The second package 300 and the first package 302 are placed in the first substrate 330 and the second substrate 320, respectively. Control bus terminals 332 and 333 that are formed on the peripheral frame portions are laid on each other so as to be brought into surface contact with each other, whereby electrical connections are made by pressure due to the weight of the substrate 320 and the lid.

In this embodiment, first and second devices can electrically be connected to the second substrate 320 and the first substrate 330 via leads 321 and 331 extending from the packages 302 and 300, respectively.

The state that the particular function is operational is a state that both of the first substrate 330 and the second substrate 320 are closed. However, for the sake of description, a state that the lid is opened and hence the first package 302 can be seen is shown in FIG. 8 (*a*) and a state that the second package 300 can be seen is shown in FIG. 8 (*b*).

As described above, the packages 302 and 300 can be mounted and detached easily, whereby a highly reliably semiconductor device can be provided.

Embodiment 9

Figure 9:
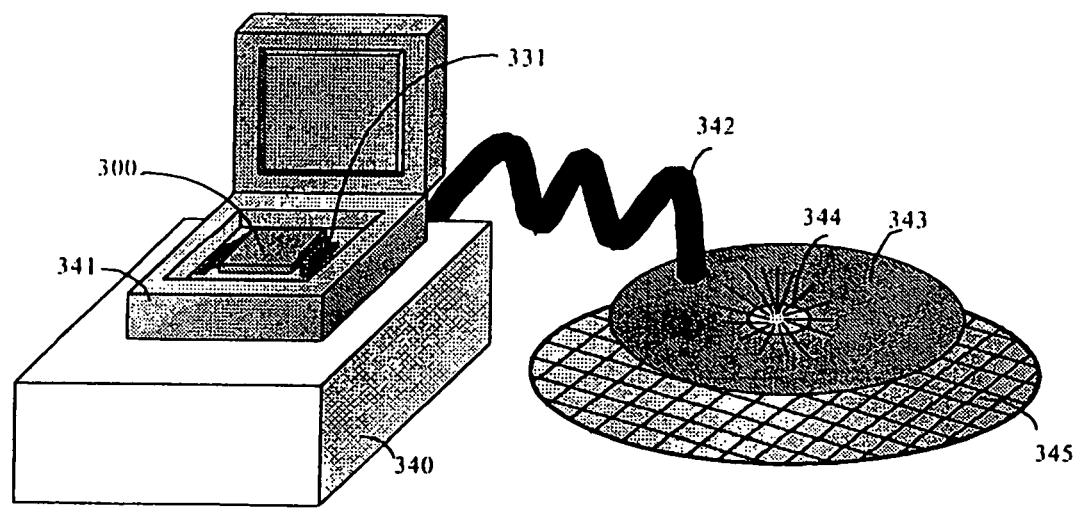
FIG. 9 is a perspective view of a system device according to a ninth embodiment of the invention.

In this embodiment, as shown in FIG. 9, a testing function of conducting a burn-in stress test on a semiconductor wafer as a first device is separately implemented in a second device.

The testing function is a probing testing function that is performed prior to mounting to judge the appropriateness of a manufacturing process. In general, probing tests include DC tests for testing performance of transistors such as an output current measurement and a leak current measurement on input/output circuit cells and what is called a scan test in which current measurements of the above kinds are performed in a state that the toggle rate of internal logic circuits is made close to 100%. In this case, probe electrodes formed on a probe card 343 are brought into contact with the semiconductor wafer 345 and burn-in stress signals are supplied, via a connection line 342, from the second device in a package 300. Outputs of the semiconductor wafer 345 are supplied to a general-purpose testing apparatus 340 also via the connection line 342.

As described above, power supply cells capture a power voltage that is supplied from the probing testing device via the probe card 343 that is connected to the general-purpose testing apparatus 340 via a socket 341, and perform a self-test.

Although the testing device is indispensable for the semiconductor device, it need not always be used. In particular, a stress forming circuit etc. for a self-diagnosis are not necessary for purposes other than a test to be conducted after manufacture. Therefore, implementing those circuits as external circuits makes it possible to reduce the size and the power consumption of the semiconductor device to a large extent.

Embodiment 10

Figure 10:
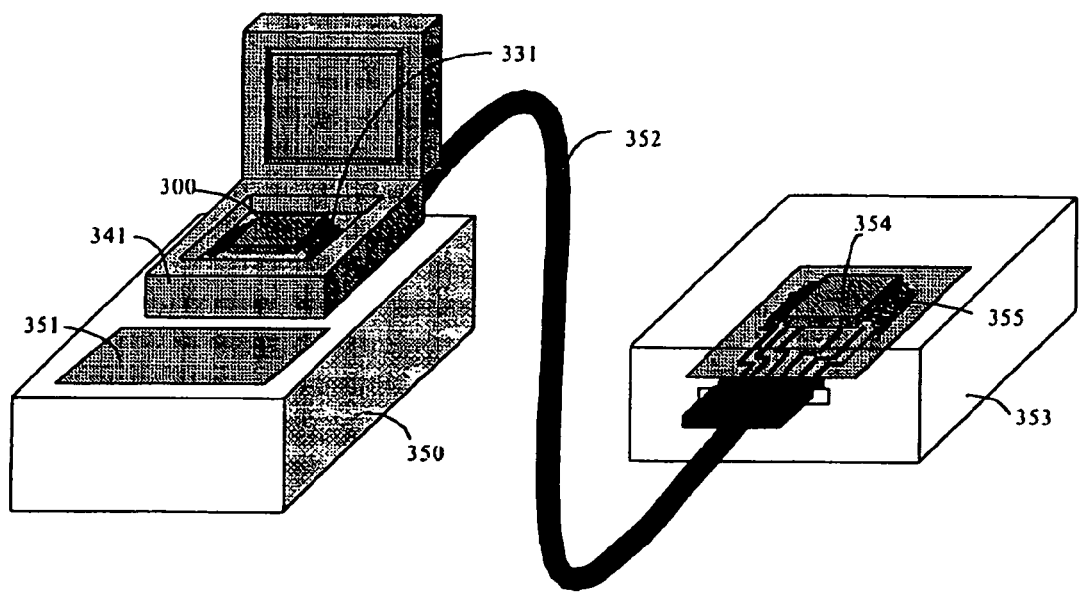
FIG. 10 is a perspective view of a system device according to a 10th embodiment of the invention.

The ninth embodiment is directed to the testing device that is used for a test that is conducted immediately after manufacture of a semiconductor wafer. In this embodiment, as shown in FIG. 10, functions of a cellular phone 353 that is connected, via lead terminals 355, to a first package 354 incorporating a first device that is used for a cellular phone or the like are set in the first device by means of a package 300 incorporating a second device.

The second package 300 incorporating the second device and a socket 341 connected to the second package 300 are configured in the same manners as in the ninth embodiment. In this embodiment, a function setting apparatus 350 for setting functions in the first device is connected to the second package 300 incorporating the second device. Manipulations are performed on a function setting manipulation surface 351 of the function setting apparatus 350.

This system device also enables miniaturization and power saving.

Embodiment 11

Figure 11:
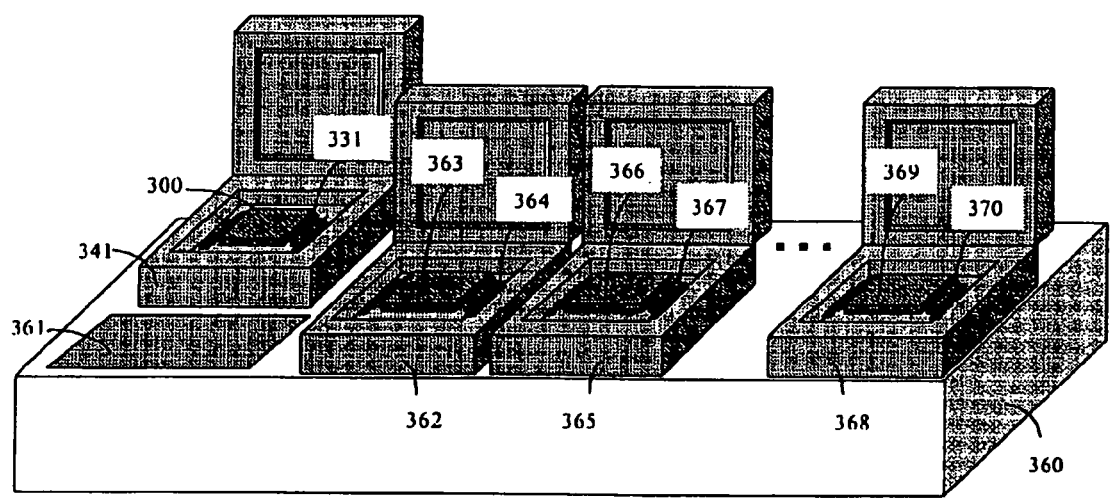
FIG. 11 is a perspective view of a system device according to an 11th embodiment of the invention.

In this system device, as shown in FIG. 11, sockets 362, 365, 368 that are mounted with a plurality of semiconductor devices 363, 366, 369, respectively, each of which incorporates a first device having a prescribed function and being capable of accommodating a particular function, that is, rewriting manipulations, are attached to a single function setting apparatus 360 such as a general-purpose rewriting apparatus, whereby functions can be set in the semiconductor devices 363, 366, 369 in parallel.

The semiconductor devices 363, 366, 369 are connected to the sockets 362, 365, 368 via lead terminals 364, 367, and 370, respectively. Rewriting manipulations that are performed on a manipulation surface 361 of the function setting apparatus 360 are effected on the semiconductor devices 363, 366, 369 via the sockets 362, 365, 368 by using the particular function of a second device that is incorporated in a second package 300 that is mounted in a socket 341.

This system device makes it possible to perform rewriting manipulations on a plurality of semiconductor devices in parallel and hence increase the efficiency of work.

Next, specific embodiments of the invention will be described.

Specific Embodiment 1

First, a design method of a semiconductor device according to the invention will be described.

Figure 12:
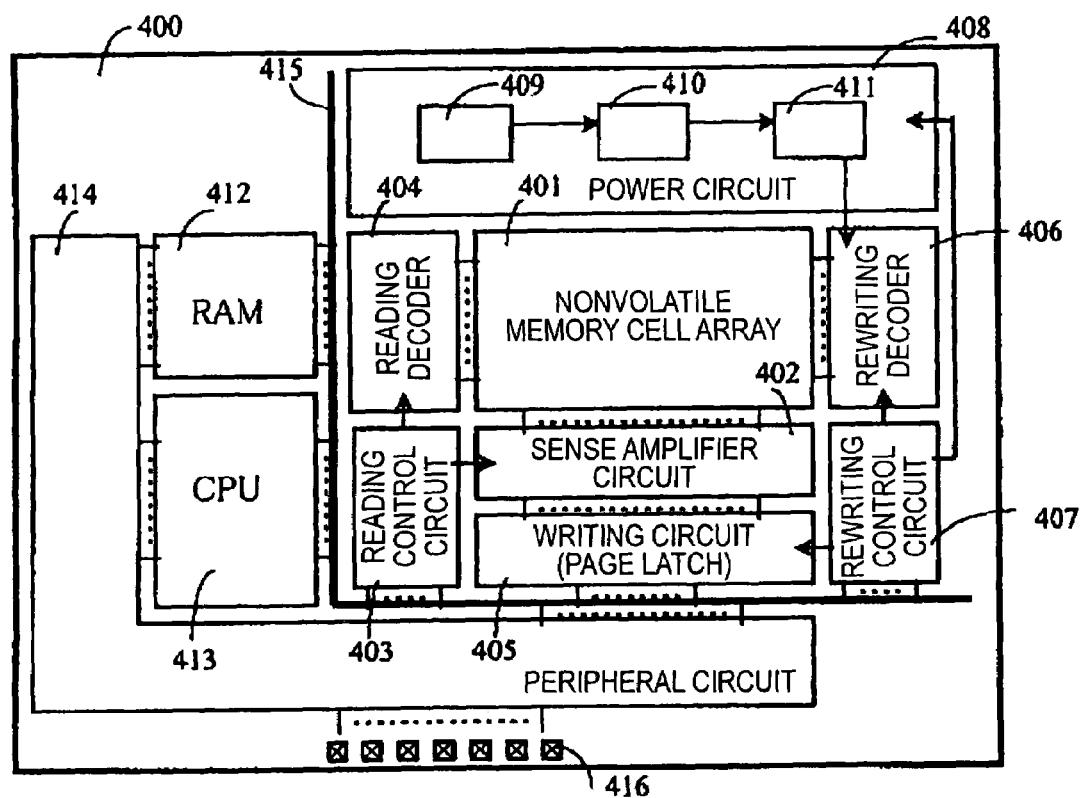
FIG. 12 illustrates a layout of a conventional semiconductor device.
Figure 13:
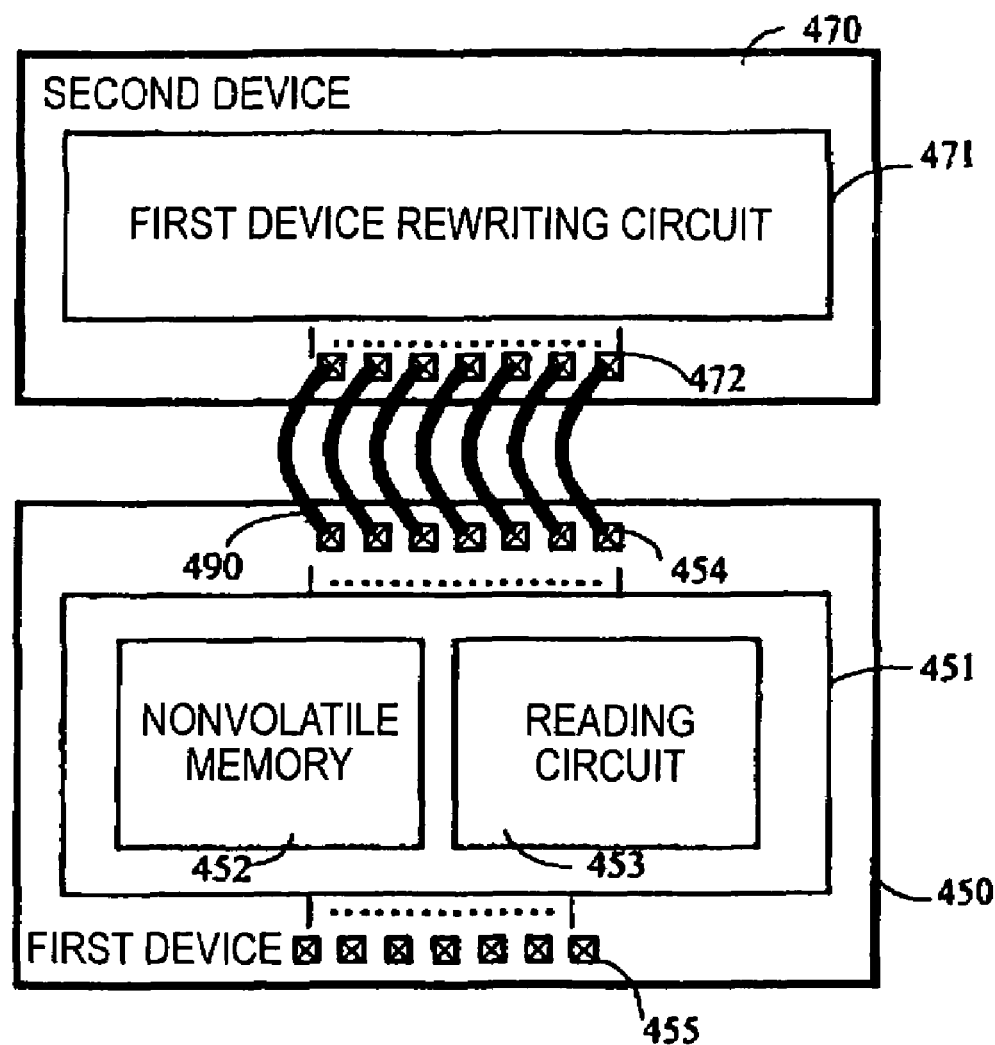
FIG. 13 is a schematic diagram of a system device according to a first specific embodiment of the invention.

As shown in FIG. 13, a nonvolatile-memory-incorporated microcomputer 400 having a layout of FIG. 12 is redesigned so as to be function-separated into a first device 450 and a second device 470 that can be connected externally to the first device 450 and gives the first device 450 a non-always-used particular function to so that the first device 450 can perform the particular function. The nonvolatile-memory-incorporated microcomputer 400 is also redesigned in such a manner that the two devices 450 and 470 can be connected to each other electrically; that is, they are connected to each other by signal lines 490.

The nonvolatile-memory-incorporated microcomputer 400 is composed of a nonvolatile memory cell array 401, a sense amplifier circuit 402 that is connected to the nonvolatile memory cell array 401, a reading control circuit 403, a reading decoder 404, a writing circuit 405, a rewriting decoder 406, a rewriting control circuit 407, a power circuit 408, a RAM 412, a CPU 413, and peripheral circuits 414. The power circuit 408 is composed of a reference voltage trimming circuit 409, a reference voltage generation circuit 410, and a rewriting voltage generation circuit 411.

As outlined in FIG. 13, among the above circuits, a rewriting circuit 471 that is a non-always-used circuit is separated from the other circuits and formed on another substrate as a second device 470. The remaining circuits such as a nonvolatile memory 452 and a reading circuit 453 are made a first device 450.

The first device 450, which is the portion excluding the rewriting circuit 471, is a microcomputer that incorporates a read-only nonvolatile memory and is equipped with the nonvolatile memory 452 and the reading circuit 453.

Figure 14:
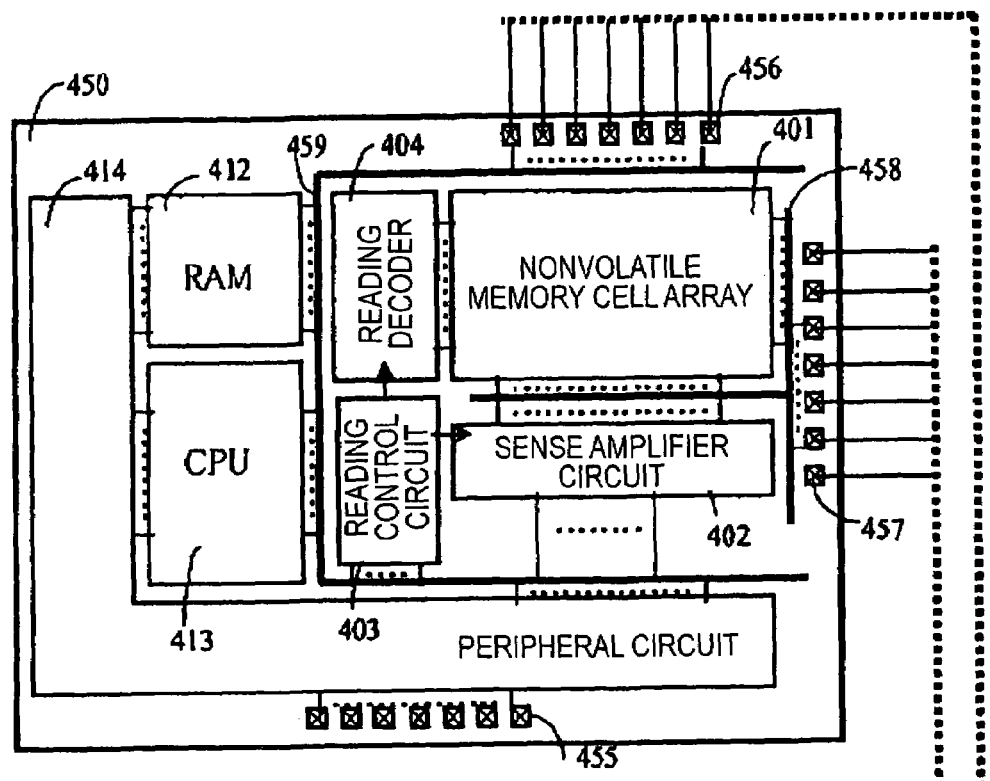
FIG. 14 illustrates, in detail, the system device according to the first specific embodiment of the invention.
Figure 14:
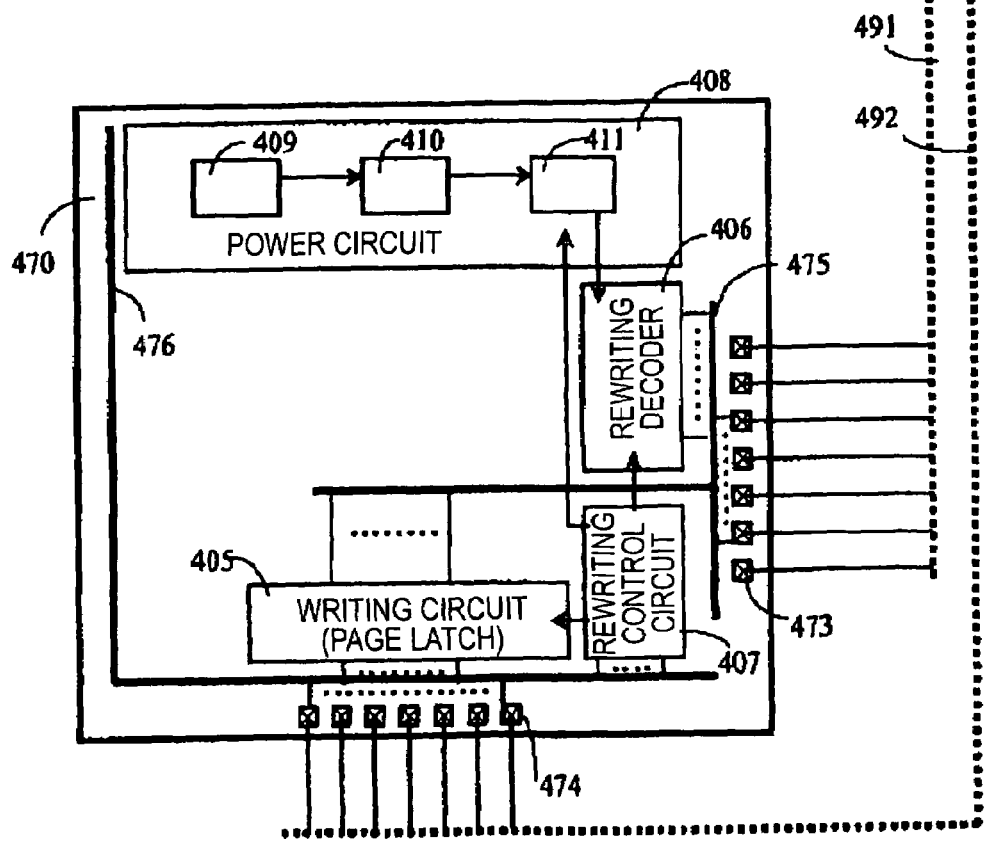

As shown in FIG. 14 in detail, this specific embodiment is characterized in that the writing device (second device) 470 for the nonvolatile memory 452 of the first device 450 is externally connected to the first device 450.

The first device 450 is composed of the nonvolatile memory cell array 401, the sense amplifier circuit 402 that is connected to the nonvolatile memory cell array 401, the reading control circuit 403, the reading decoder 404, the RAM 412, the CPU 413, and the peripheral circuits 414.

The first device 450 is controlled via control terminals 455.

Activation signals are sent from a rewriting control connection terminal group 456 of the first circuit 450 to a rewriting control connection terminal group 474 of the second device 470 via a bus connection line 492. On the other hand, instruction signals are sent from a rewriting signal connection terminal group 473 of the second device 470 to a rewriting signal connection terminal group 457 of the first device 450 via a rewriting bus signal connection line 491.

This device is such that only the non-always-used rewriting circuit 471 is a separate device and is connected to the first device 450 only when rewriting is necessary and that the rewriting circuit 471 is caused to operate only in response to an instruction from the first device 450. The first device 450 can be miniaturized without lowering its functionality.

The particular function of rewriting is realized in such a manner that the second device 470 is activated by signals sent from the first device 450 and rewriting power is supplied from the second device 470 to the first device 450. Therefore, the particular function can be realized while a user can perform manipulations with high controllability without being aware of the presence of the second device 470.

Specific Embodiment 2

Figure 15:
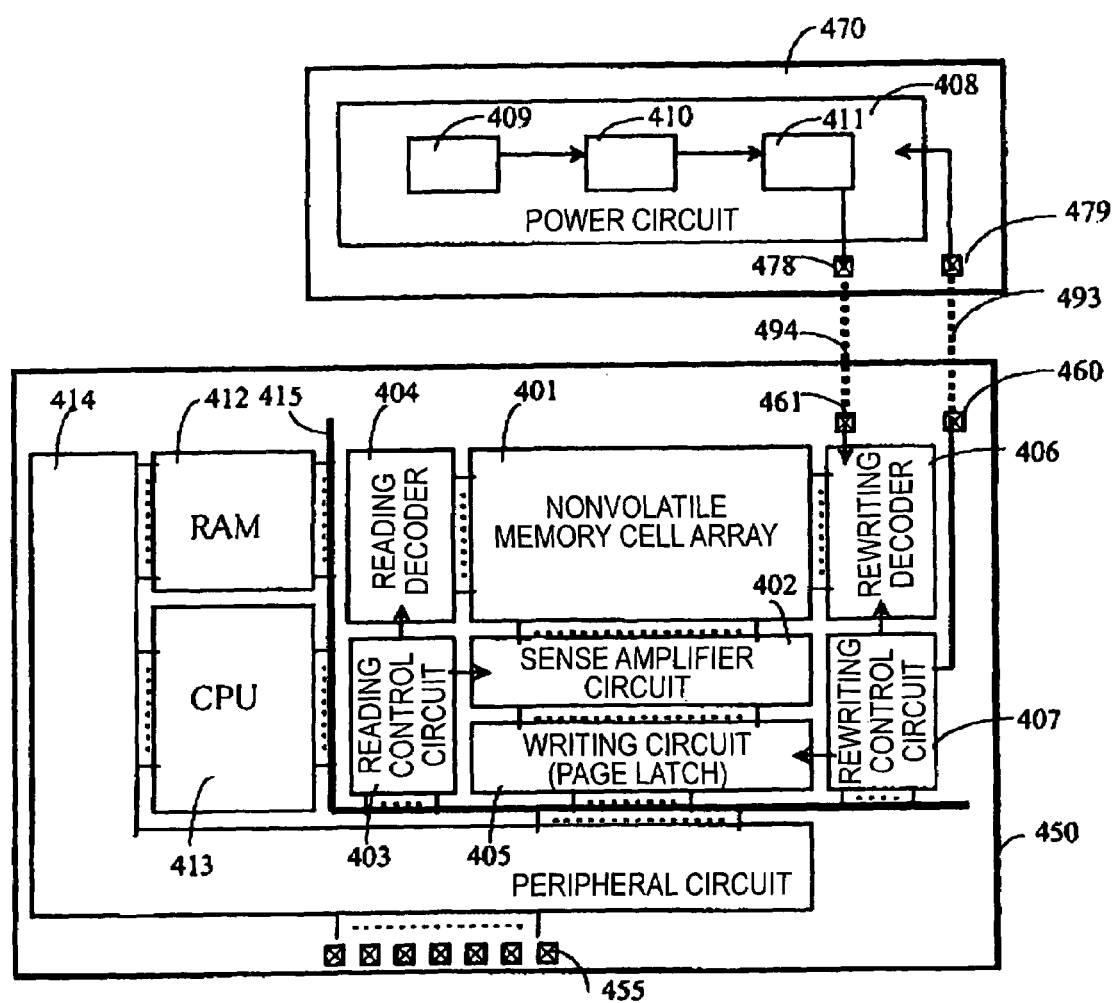
FIG. 15 illustrates, in detail, a system device according to a second specific embodiment of the invention.

Whereas in the first specific embodiment the rewriting circuit 471 is separated as the second device 470, as shown in FIG. 15 this specific embodiment is characterized in that only the rewriting power circuit 408 is separated as the second device 470.

In this specific embodiment, a control signal is sent from a rewriting control terminal 460 of the first device 450 to a rewriting control terminal 479 of the second device 470 via a rewriting control terminal 479 of the second device 470 via a rewriting control connection line 493, whereby the power circuit 408 is driven. A power supply voltage is supplied from a rewriting power connection terminal 478 of the second device 470 to a rewriting power connection terminal 461 of the first device 410 via a rewriting power connection line 494.

The other circuits etc. are the same as in the first specific embodiment. The same circuits etc. are given the same reference numeral.

Also in this device, the size and the power consumption of the first device 410 can be made much smaller than those of the conventional device in which the power circuit 408 and the other circuits are integrated on a single substrate.

Specific Embodiment 3

Figure 16:
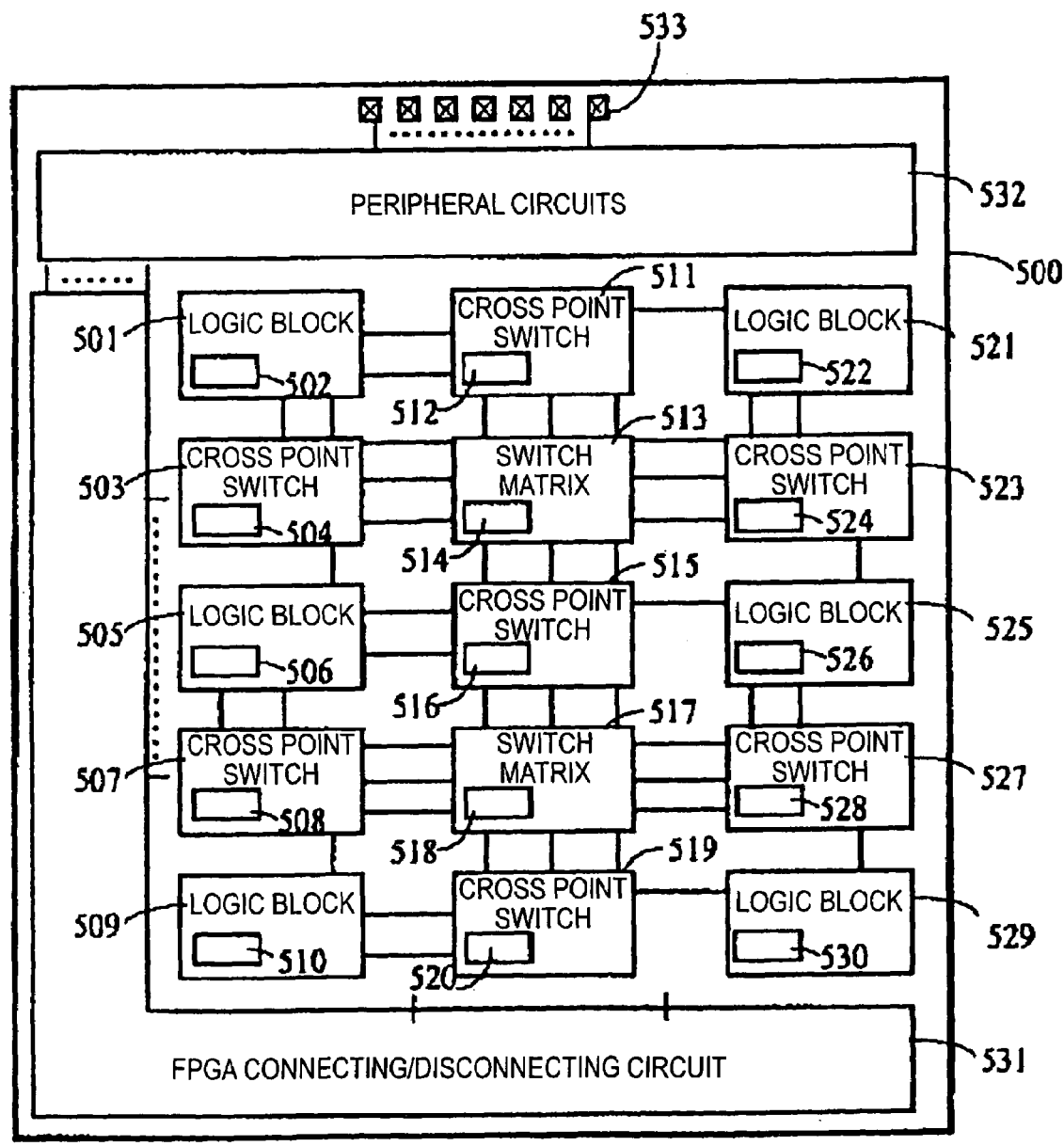
FIG. 16 illustrates a layout of a conventional semiconductor device.
Figure 17:
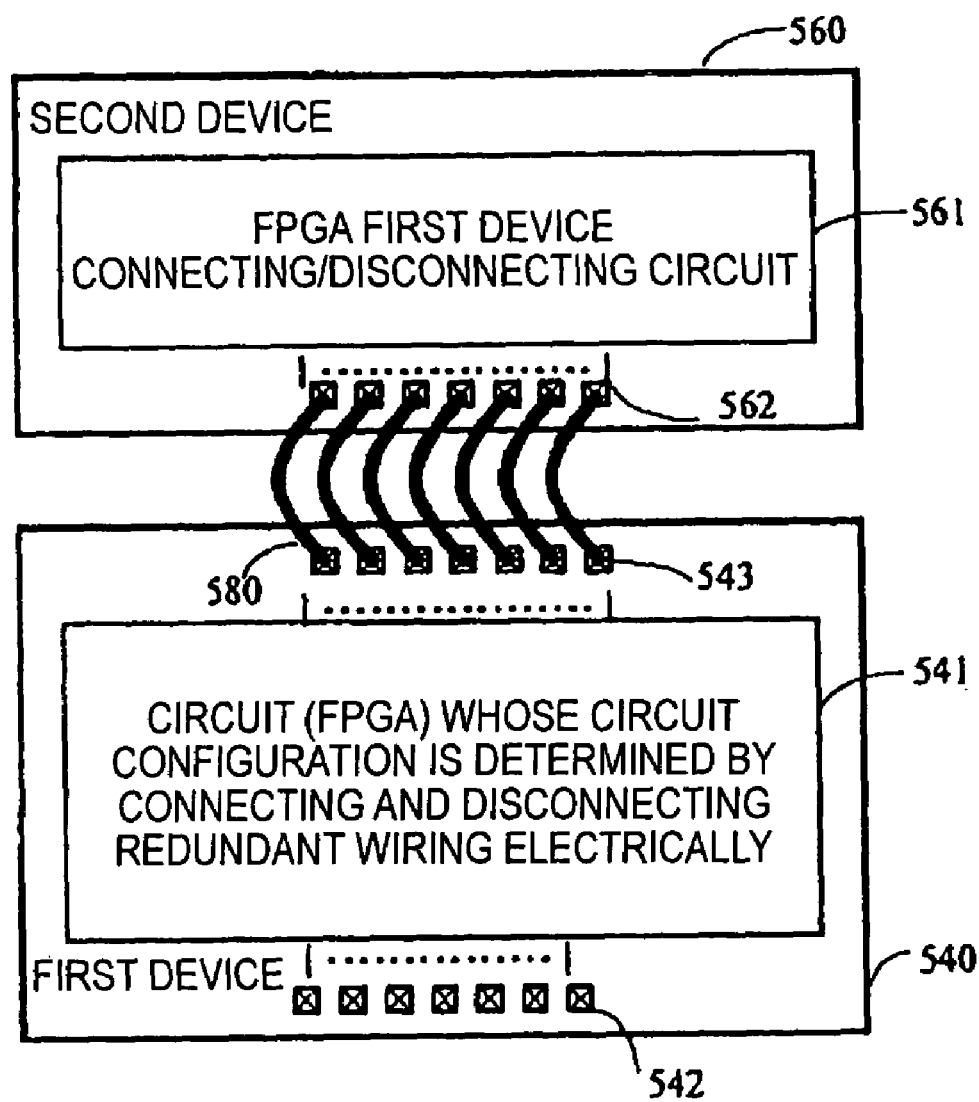
FIG. 17 is a schematic diagram of a system device according to a third specific embodiment of the invention.

This specific embodiment is characterized in that an FPGA 500 which is a programmable gate array having a layout of FIG. 16 and including a redundant circuit having redundant wiring for forming prescribed logic blocks is redesigned in such a manner that as shown in FIG. 17 an FPGA connecting/disconnecting circuit 561 is function-separated as a second device 560 and is connected only when connections and disconnections are made.

Figure 18:
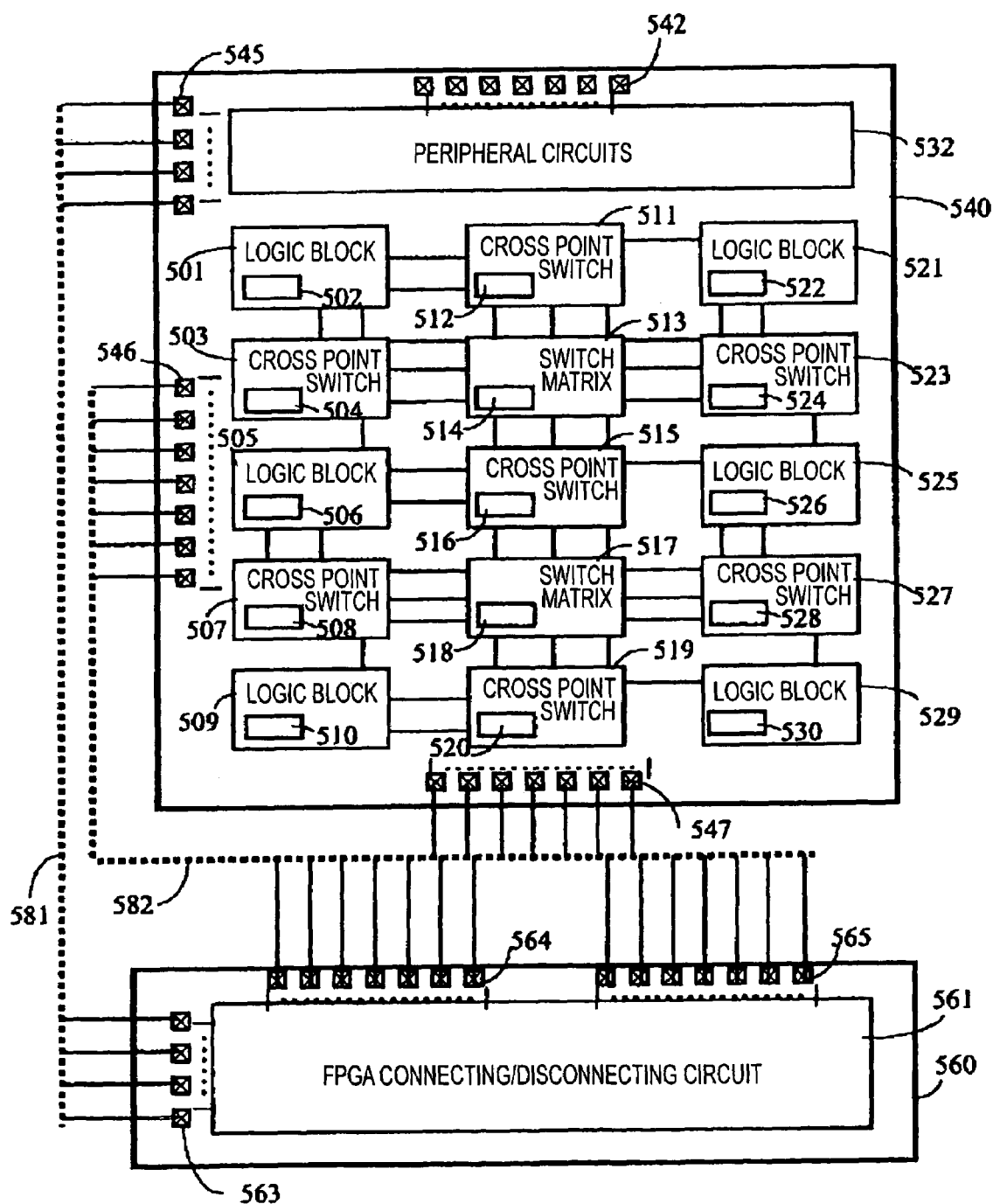
FIG. 18 illustrates, in detail, the system device according to the third specific embodiment of the invention.

FIG. 17 is a schematic diagram of an important part and FIG. 18 is a detailed explanatory diagram. As shown in FIG. 17, this device is designed so as to be function-separated into a first device 540 and the second device 560 that can be connected externally to the first device 540 and gives the first device 540 a gate array connecting/disconnecting function as a non-always-used particular function by means of the connecting/disconnecting circuit 560. This device is also designed in such a manner that the two devices 540 and 560 can be connected to each other electrically; that is, they are connected to each other by signal lines 580. The second device 560 is activated by supplying signals from connection/disconnection control terminals 543 of the first device 540 to connection/disconnection control terminals 562 of the second device 560. A logic circuit is formed by making connections and disconnections in the FPGA 541 by sending connection/disconnection control signals from the connecting/disconnecting circuit 561 of the second device 560 to the FPGA 541 of the first device 540.

Reference numeral 542 denotes control terminals of the first device 540.

As shown in FIG. 18, the first device 540 and the second device 560 are bus-connected to each other via a connection/disconnection control connection line 581 and a connection/disconnection signal connection line 582. When control signals are transmitted from connection/disconnection control terminals 545 of the first device 540 to the FPGA connecting/disconnecting circuit 561 via connection/disconnection control terminals 563 of the second device 560, the FPGA connecting/disconnecting circuit 561 generates connection/disconnection signals, which are supplied from connection/disconnection signal terminals 564 and 565 to connection/disconnection signal terminals 546 and 547 of the first device 540.

In the first device 540, switch matrices 513 and 517 are generated through switching of cross point switches 503, 507, 511, 515, 519, 523, and 527, whereby a combination of logic blocks 501, 505, 509, 521, 525, and 529 is determined. Setting histories of the logic blocks 501, 505, 509, 521, 525, and 529 are recorded in logic block setting memories 502, 506, 510, 522, 526, and 530, respectively. Setting histories of the cross point switches 503, 507, 511, 515, 519, 523, and 527 are recorded in cross point switch setting memories 504, 508, 512, 520, 524, and 528, respectively. Setting histories of the switch matrices 513 and 517 are recorded in switch matrix setting memories 514 and 518, respectively.

Reference numerals 532 and 542 denote peripheral circuits and control terminals of the first device 540, respectively.

As described above, according to this specific embodiment, the redundant circuit setting function, which is not necessary during ordinary use, can be connected to the first device 540 and used only when it should be used. Therefore, the size and the power consumption of the first device 540 can be reduced.

Specific Embodiment 4

Figure 19:
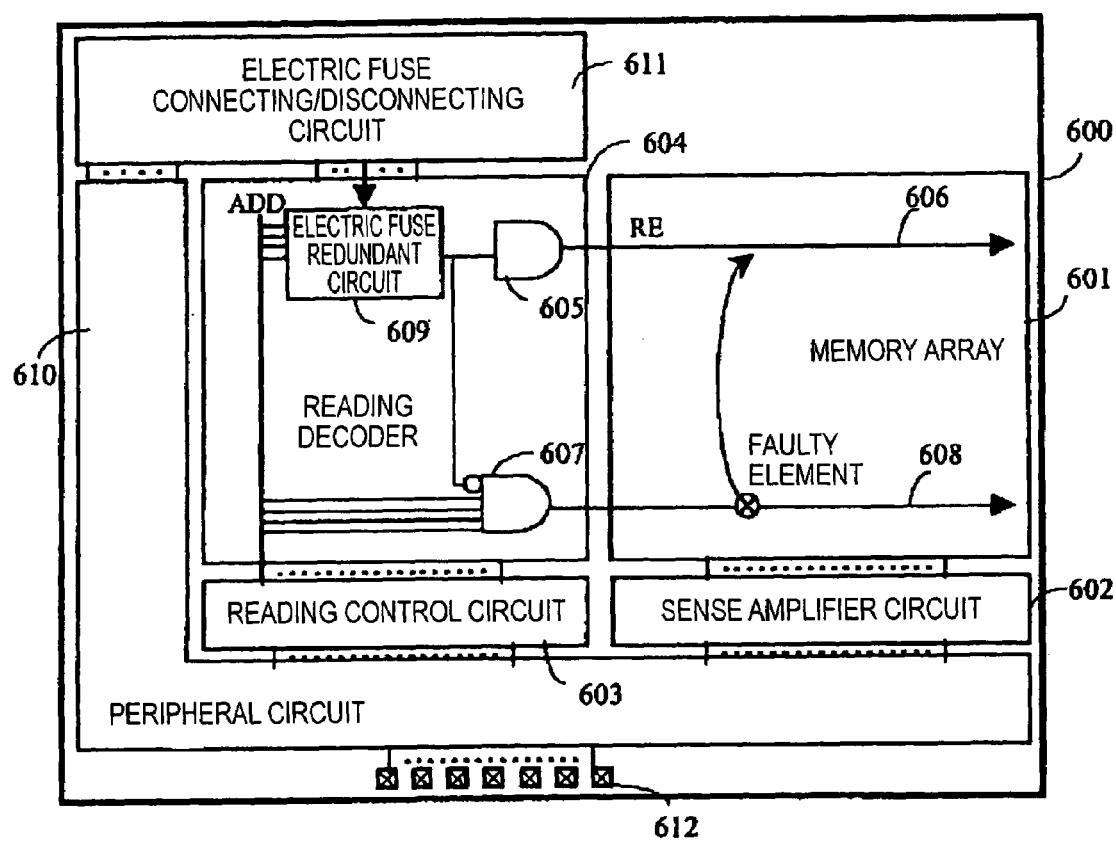
FIG. 19 illustrates a layout of a conventional semiconductor device.
Figure 20:
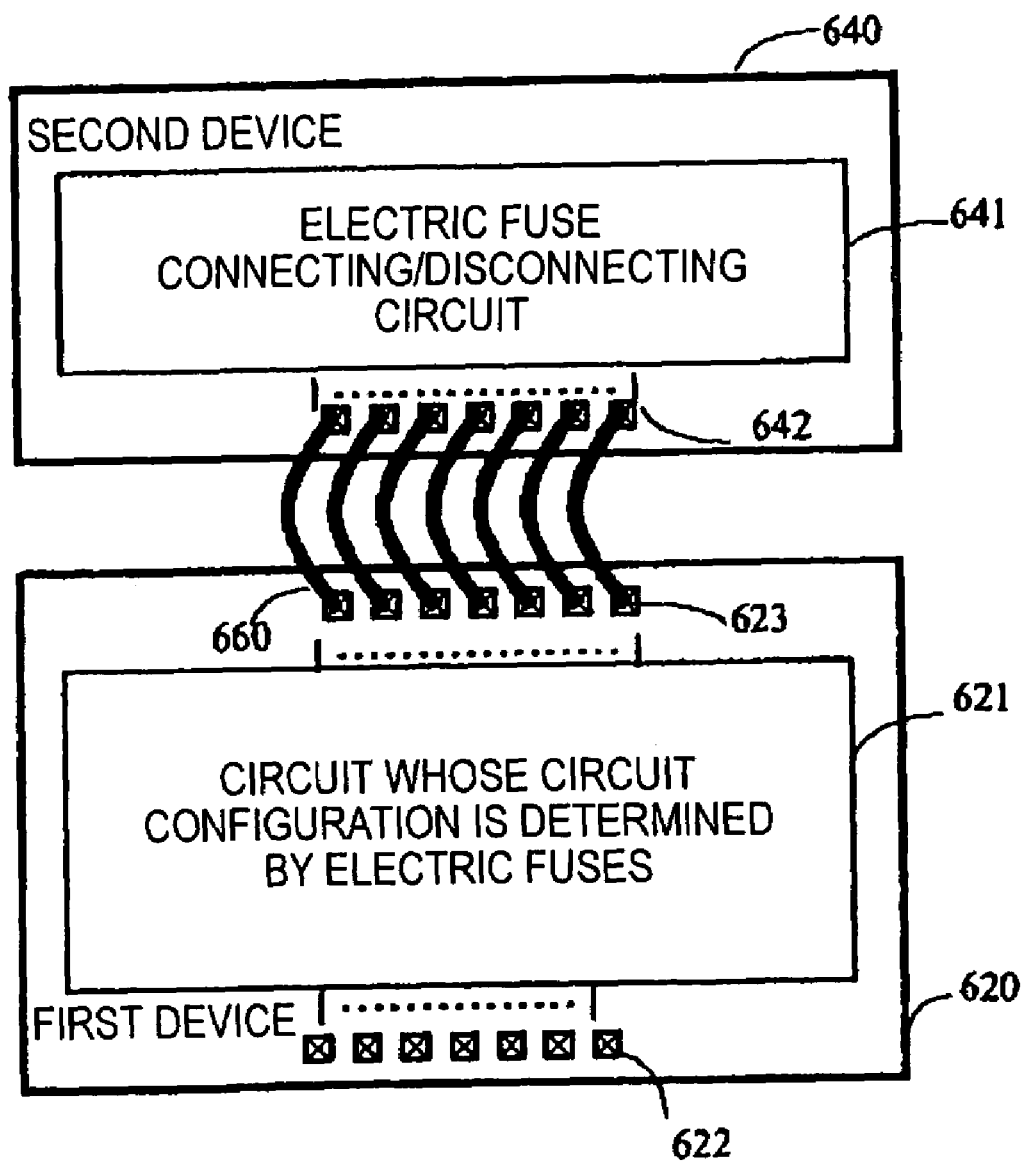
FIG. 20 is a schematic diagram of a system device according to a fourth specific embodiment of the invention.

As shown in FIG. 20, this specific embodiment is characterized in that a circuit 600 which has a layout of FIG. 19 and is equipped with an electric fuse connecting/disconnecting circuit 611 and in which a circuit configuration of a memory array is determined by electric fuses is separated into an electric fuse connecting/disconnecting circuit 641 as a second device 640 and a first device 620 having a circuit 621 whose circuit function is determined by connecting and disconnecting electric fuses with the second device 640.

The above-mentioned particular function is a function of connecting and disconnecting the electric fuses.

Figure 21:
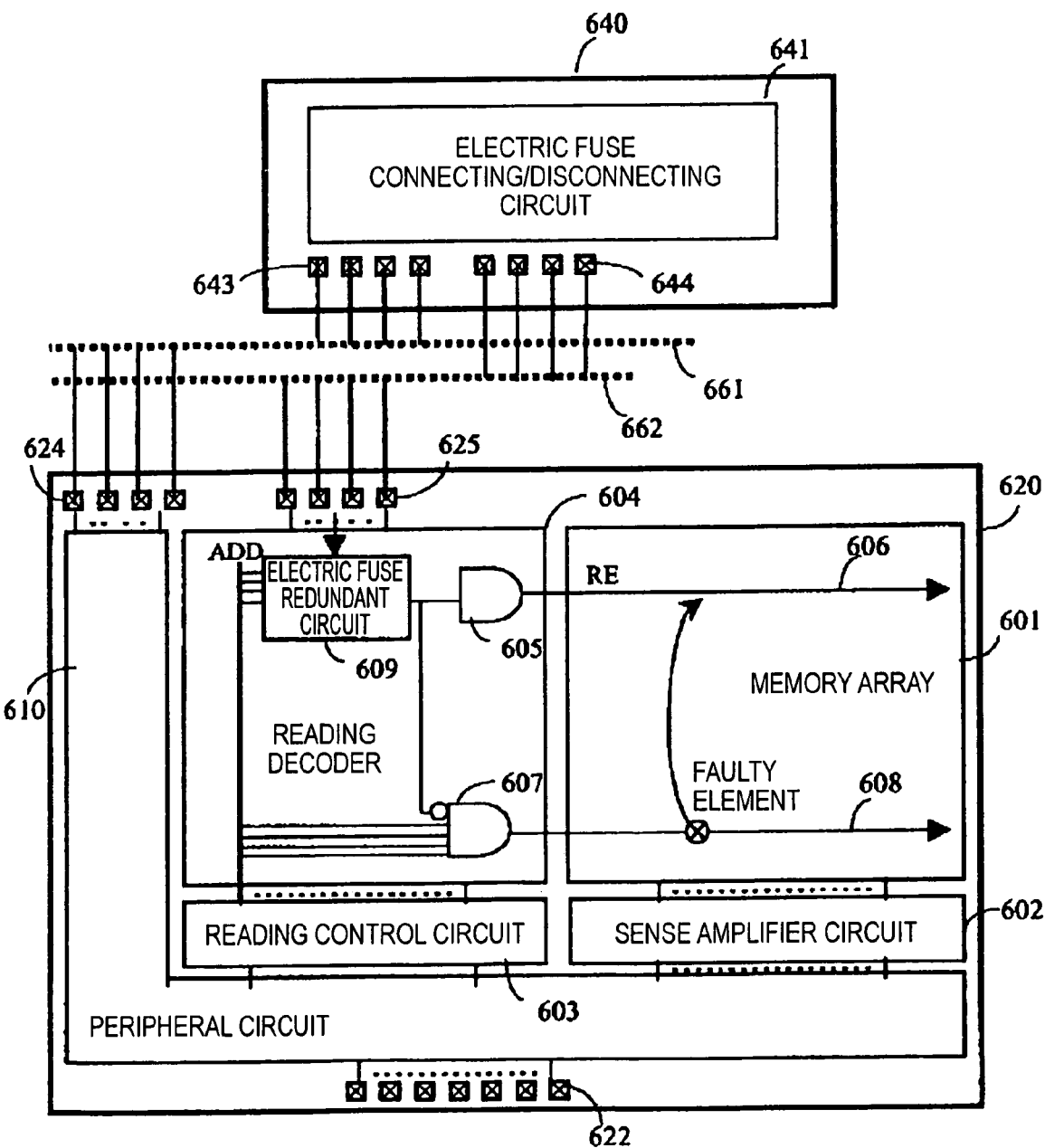
FIG. 21 illustrates, in detail, the system device according to the fourth specific embodiment of the invention.

FIG. 20 is a schematic diagram of an important part and FIG. 21 is a detailed explanatory diagram. As shown in FIG. 20, this device is designed so as to be function-separated into the first device 620 and the second device 640 that can be connected externally to the first device 620 and gives the first device 620 a gate array connecting/disconnecting function as an electric fuse connecting/disconnecting function by means of the connecting/disconnecting circuit 641. This device is also designed in such a manner that the two devices 620 and 640 can be connected to each other electrically; that is, they are connected to each other by signal lines 660. The second device 640 is activated by supplying signals from connection/disconnection control terminals 623 of the first device 620 to connection/disconnection control terminals 642 of the second device 640. A logic circuit is formed by making connections and disconnections in the circuit 621 whose circuit configuration is determined by the electric fuses by sending connection/disconnection control signals from the connecting/disconnecting circuit 641 of the second device 640 to the circuit 621 of the first device 620.

Reference numeral 622 denotes control terminals of the first device 620.

As shown in FIG. 21, the first device 620 and the second device 640 are bus-connected to each other via a connection/disconnection control connection line 661 and a connection/disconnection signal connection line 662. When control signals are transmitted from connection/disconnection control terminals 624 of the first device 620 to the electric fuse connecting/disconnecting circuit 641 via connection/disconnection control terminals 643 of the second device 640, the electric fuse connecting/disconnecting circuit 641 generates connection/disconnection signals, which are supplied from connection/disconnection signal terminals 644 to connection/disconnection signal terminals 625 of the first device 620.

The first device 620 is equipped with a memory array 601, a sense amplifier circuit 602, a reading control circuit 603, a reading decoder 604, redundant decoders 605, redundant word lines 606, decoders 607, word lines 608, an electric fuse redundant circuit 609, and peripheral circuits 610.

With the above configuration, the circuit for connecting and disconnecting the electric fuses, which is not necessary during ordinary use, can be connected to the first device 620 and used only when it should be used. Therefore, the size and the power consumption of the first device 620 can be reduced.

Specific Embodiment 5

Figure 22:
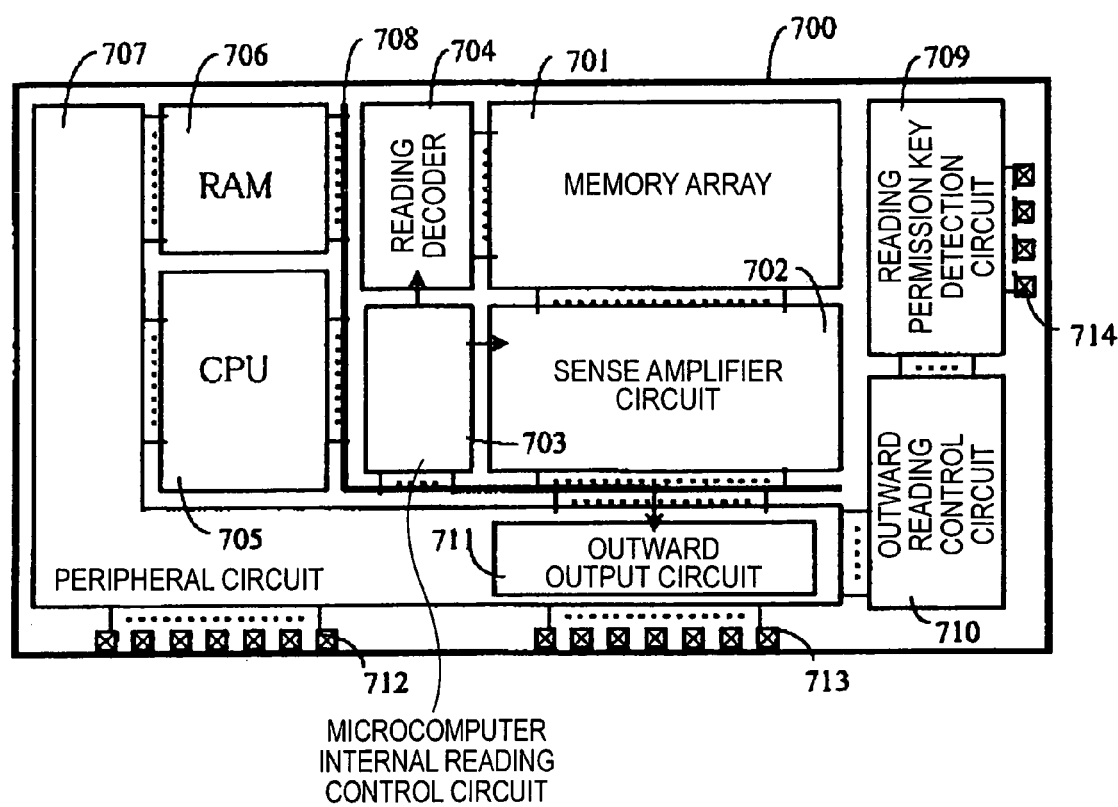
FIG. 22 illustrates a layout of a conventional semiconductor device.
Figure 23:
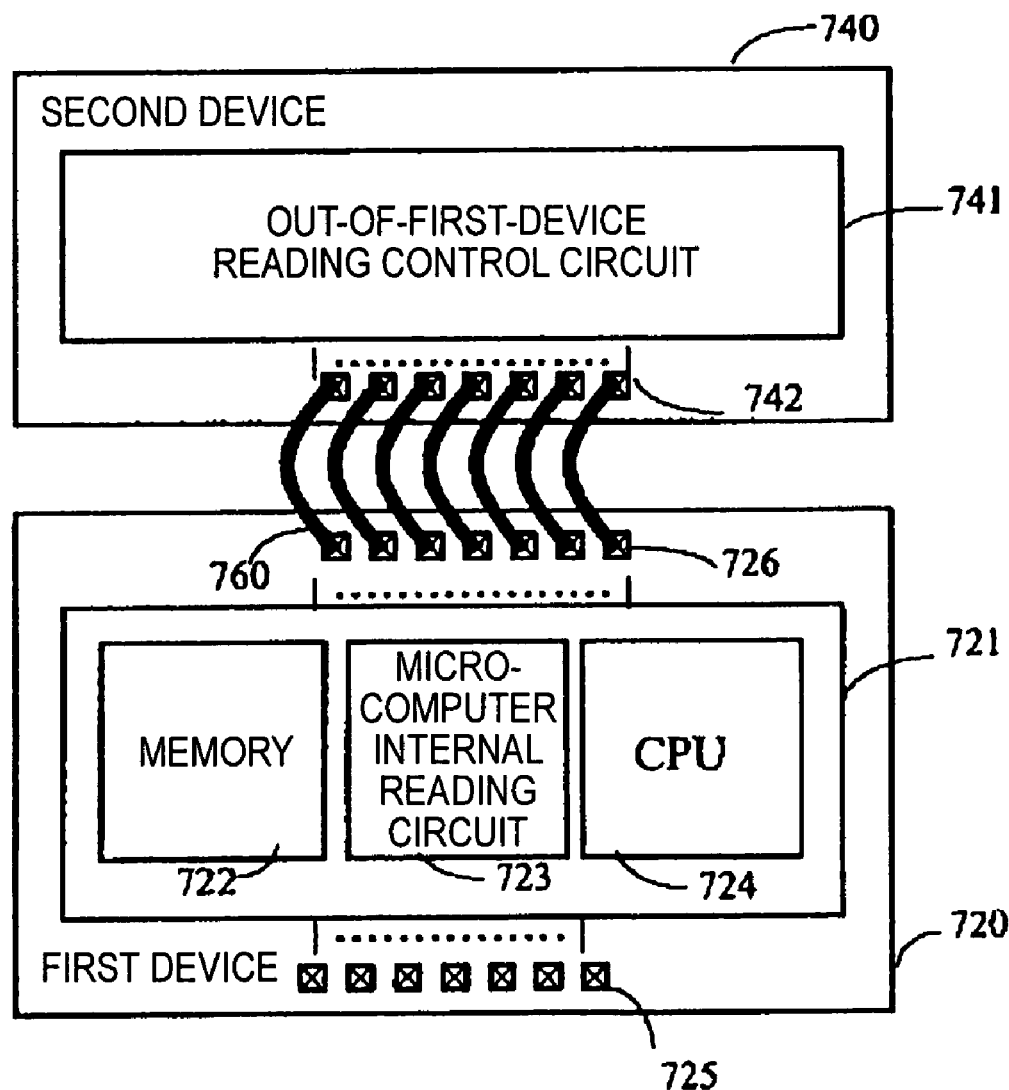
FIG. 23 is a schematic diagram of a system device according to a fifth specific embodiment of the invention.

As shown in FIG. 23, this specific embodiment is characterized in that a circuit 700 which has a layout of FIG. 22 and has a control function of controlling reading of a memory array is separated into a control circuit 741 as a second device 740 for controlling reading of information into an apparatus outside a first device 720 and the first device 720 having a circuit 721 whose circuit function is determined only when a permission signal is received from the second device 740. The above-mentioned prescribed function includes a circuit for reading information from a memory inside the first device 720. The above-mentioned particular function is a function of controlling output of information of the memory from the first device 720.

The above-mentioned particular function is a function of permitting reading from the memory.

Figure 24:
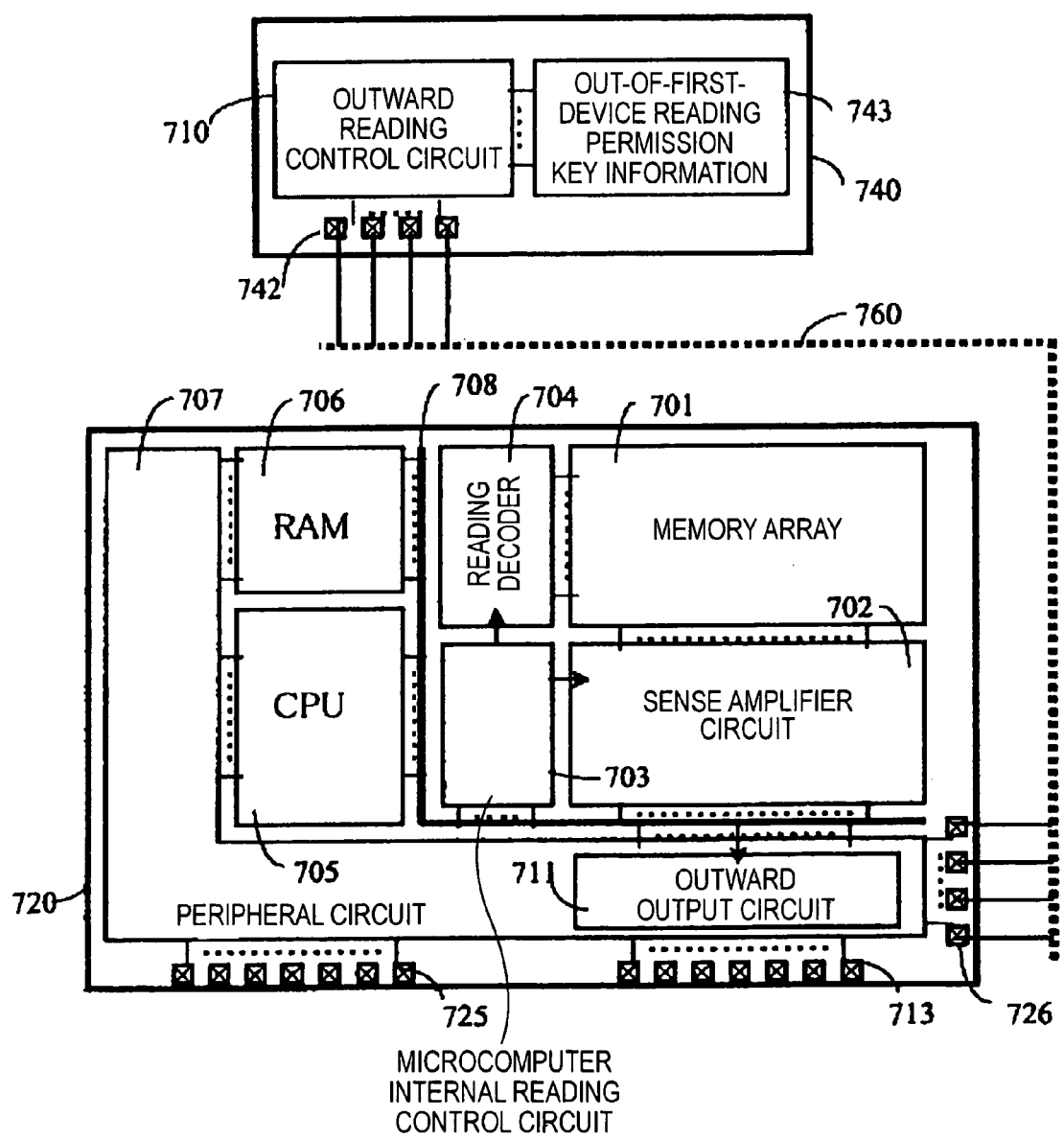
FIG. 24 illustrates, in detail, the system device according to the fifth specific embodiment of the invention.

FIG. 23 is a schematic diagram of an important part and FIG. 24 is a detailed explanatory diagram. As shown in FIG. 23, this device is designed so as to be function-separated in such a manner that an outward reading control circuit 710 of the second device 740 gives the first device 720 an outward reading control function that is a non-always-used particular function. This device is also designed in such a manner that the two devices 720 and 740 can be connected to each other electrically; that is, they are connected to each other by signal lines 760. The second device 740 is activated by supplying signals from outward reading control terminals 726 of the first device 720 to outward reading control terminals 742 of the second device 740. The outward reading control circuit 710 of the second device 740 performs collation with reading permission key information 743, and activates an outward output circuit 711 of the first device 720 only if the reading should be permitted. That is, activation signals are supplied from the outward reading control circuit 710 to the outward reading control terminals 726 of the first device 720 via the outward reading control terminals 742. In response, the outward output circuit 711 of the first device 720 outputs information stored in a memory array 701 via memory data output terminals 713.

As shown in FIG. 24, the first device 720 and the second device 740 are bus-connected to each other via an outward reading control connection line 760. When control signals are transmitted from the outward reading control terminals 726 of the first device 720 to the second device 740 as an outward reading control device via the outward reading control terminals 742 of the second device 740, the outward reading control circuit 710 performs collation with the reading permission key information 743 and generates reading control signals, which are supplied, as activation signals, to the outward reading control terminals 726 of the first device 720 via the control connection line 760.

The first device 720 is equipped with the memory array 701, a sense amplifier circuit 702, an internal reading control circuit 703, a decoder 704, a CPU 705, a RAM 706, peripheral circuits 707, a control bus 708, and the outward output circuit 711.

With the above configuration, the particular function that is not used during ordinary use is caused to operate only when the outward reading function is necessary. Therefore, the first device 720 can be miniaturized while the outward reading control function is secured.

Specific Embodiment 6

It is difficult to miniaturize devices that are required to incorporate a testing function. The invention can solve this problem, that is, makes it possible to incorporate a testing function without causing size increase.

Figure 25:
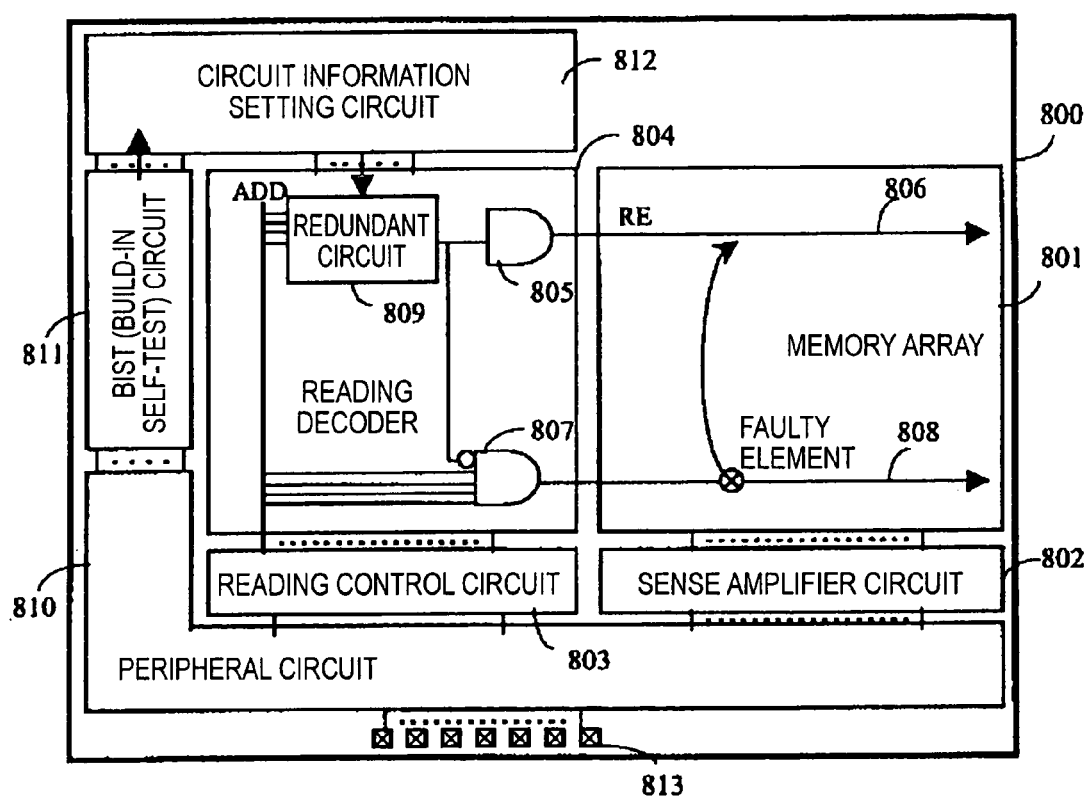
FIG. 25 illustrates a layout of a conventional semiconductor device.
Figure 26:
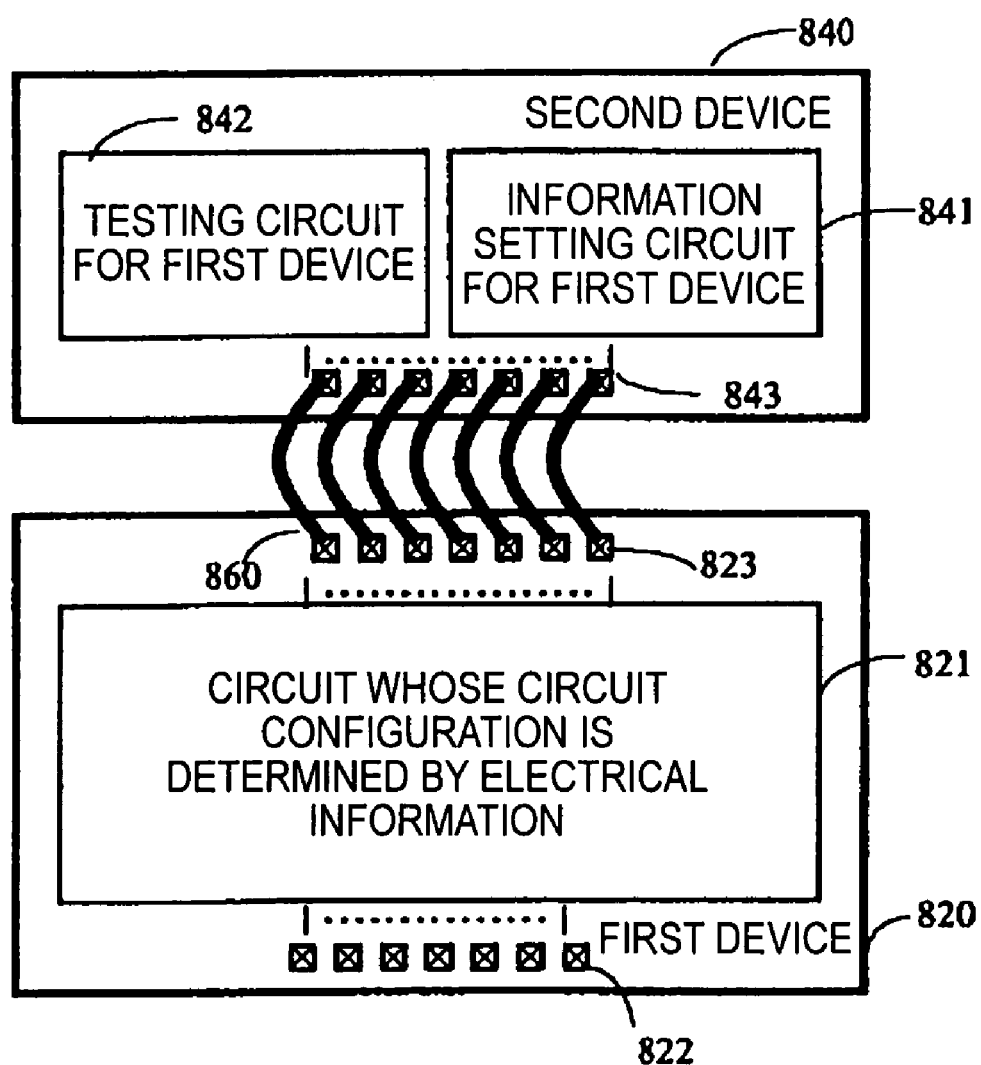
FIG. 26 is a schematic diagram of a system device according to a sixth specific embodiment of the invention.

As shown in FIG. 26, a testing circuit 842 and an information setting circuit 841 of a circuit 800 having a layout of FIG. 25 are separated, as a second device 840, from a first device 820. This device is characterized in being divided into the first device 820 and the second device 840 having the testing circuit 842 for testing the first device 820 and the information setting circuit 841 for setting information relating to the first device 820 on the basis of test results.

Figure 27:
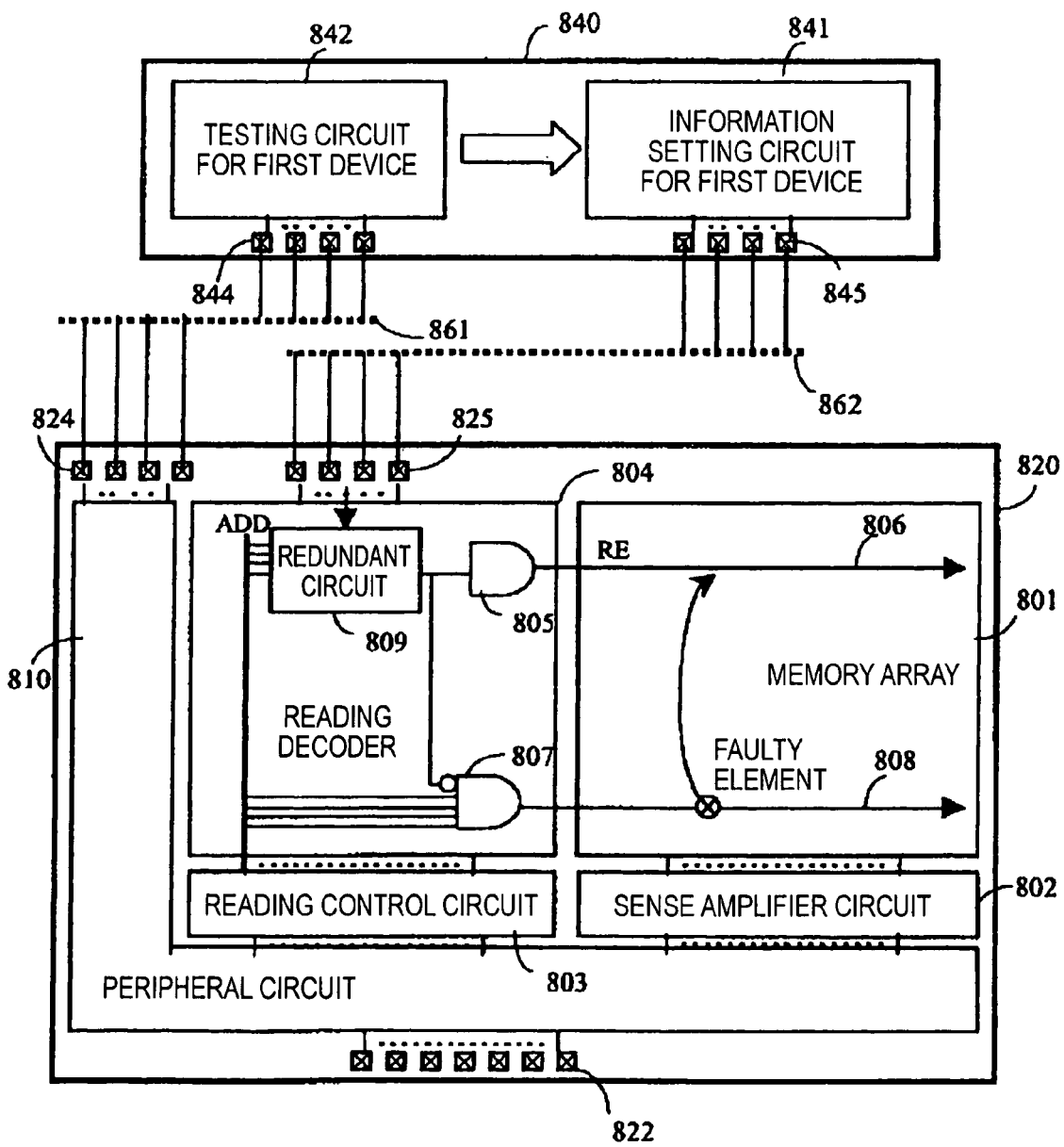
FIG. 27 illustrates, in detail, the system device according to the sixth specific embodiment of the invention.

As shown in FIG. 26 which is a schematic diagram of an important part and FIG. 27 which is a detailed explanatory diagram, this device is designed so as to be function-separated in such a manner that the second device 840 gives the first device 820 the testing function and the information setting function for the first device 820 which are non-always-used particular functions. This device is also designed in such a manner that the two devices 820 and 840 can be connected to each other electrically; that is, they are connected to each other by signal lines 861 and 862.

The second device 840 is activated by supplying signals from testing and circuit information setting control terminals 824 of the first device 820 to testing and circuit information setting control terminals 844 of the second device 840. The testing circuit 842 of the second device 840 sets the information setting circuit 841 of the first device 820. This information is supplied from circuit information setting terminals 845 to the first device 820 via an information setting signal connection line 862 and is used for setting a redundant circuit 809. That is, the testing circuit 842 of the second device 840 controls the information setting circuit 841 on the basis of test results, and circuit information setting signals are input from the circuit information setting terminals 845 to circuit information setting terminals 825 of the first device 820 via the information setting signal connection line 862.

The first device 820 is equipped with a memory array 801, a sense amplifier circuit 802, a reading control circuit 803, a reading decoder 804, redundant decoders 805, redundant word lines 806, decoders 807, word lines 808, a redundant circuit 809, and peripheral circuits 810.

It is difficult to miniaturize devices that are required to incorporate a testing function. The invention can solve this problem, that is, makes it possible to incorporate a testing function without causing size increase. Further, the invention makes it possible to perform circuit setting on the basis of test results by setting a redundant circuit.

In each of the above specific embodiments, each of the first device and the second device may either be implemented on a single substrate or be a system device having a plurality of semiconductor substrates.

In the semiconductor device according to the invention, an externally connected second circuit can give a non-always-used particular function to a first device having a prescribed circuit function. Therefore, not provided with the non-always-used particular function during ordinary use, the size and the power consumption of a semiconductor chip of the semiconductor device can be reduced.

In the system device according to the invention, a particular function that is not always used with a semiconductor device is implemented as a separate device and can be incorporated by electric connection. Therefore, a small, easy-to-handle system device can be provided.

Further, in a design method according to the invention, a circuit to be integrated on a semiconductor substrate is designed so as to be function-separated into a first circuit and a second circuit that can be connected externally to the first circuit and gives the first circuit a non-always-used particular function to the first circuit so that the first circuit can perform the particular function. The circuit is also designed in such a manner that the first and second circuits can be connected to each other electrically. Therefore, the first circuit can be miniaturized without lowering its functionality.

What is claimed is:

1. A semiconductor device, comprising:

a first circuit having a prescribed circuit function;

wherein a second circuit is formed so as to be able to be connected externally to the first circuit so as to give the first circuit a non-always-used particular function and to thereby allow the first circuit to perform the particular function;

the first circuit comprises a redundant circuit that is provided with wiring for forming prescribed logic blocks in the first circuit, and is configured in such a manner that its circuit function is determined by external redundancy setting; and the particular function includes a circuit for setting the redundant circuit.

2. The semiconductor device according to claim 1, wherein:

the first circuit comprises a programmable gate array FPGA (field programmable gate array).

3. A system device, comprising:

a first device having a first circuit that provides a prescribed circuit function; and a second circuit electrically connected to the first circuit of the first device, the system device;

wherein the second circuit gives the first circuit a non-always-used particular function and to thereby allow the first circuit to perform the particular function;

each of the first device and the second device comprises an exchange circuit for serially supplying or receiving control signals for giving the particular function and a register for storing control signals for giving the particular function; and signals are serially exchanged between the first device and the second device, whereby the particular function is given to the first device.

* * * * *